(12) United States Patent
Kwon

(10) Patent No.: US 11,386,957 B2
(45) Date of Patent: Jul. 12, 2022

(54) SEMICONDUCTOR MEMORY DEVICE

(71) Applicant: SK hynix Inc., Gyeonggi-do (KR)

(72) Inventor: Tae Heui Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 130 days.

(21) Appl. No.: 16/932,190

(22) Filed: Jul. 17, 2020

(65) Prior Publication Data
US 2021/0233588 A1 Jul. 29, 2021

(30) Foreign Application Priority Data
Jan. 28, 2020 (KR) .................. 10-2020-0010018

(51) Int. Cl.
*G11C 16/04* (2006.01)
*G11C 16/26* (2006.01)
*G11C 16/08* (2006.01)
*G11C 16/30* (2006.01)
*G11C 16/34* (2006.01)
*G11C 16/24* (2006.01)

(52) U.S. Cl.
CPC .......... *G11C 16/0483* (2013.01); *G11C 16/08* (2013.01); *G11C 16/24* (2013.01); *G11C 16/26* (2013.01); *G11C 16/30* (2013.01); *G11C 16/3459* (2013.01)

(58) Field of Classification Search
CPC .................................................. G11C 16/3459
See application file for complete search history.

(56) References Cited

U.S. PATENT DOCUMENTS

| | | | |
|---|---|---|---|
| 8,995,192 B2 * | 3/2015 | Khouri .............. | G11C 16/0483 365/185.17 |
| 2015/0092495 A1 * | 4/2015 | Jung .................. | G11C 16/3459 365/185.12 |
| 2016/0217868 A1 * | 7/2016 | Dutta ................... | G11C 16/349 |

FOREIGN PATENT DOCUMENTS

| KR | 10-2013-0070928 | 6/2013 |
|---|---|---|
| KR | 10-2017-0069756 | 6/2017 |

* cited by examiner

*Primary Examiner* — Douglas King
(74) *Attorney, Agent, or Firm* — IP & T Group LLP

(57) ABSTRACT

A semiconductor memory apparatus may include a cell string and a page buffer. The cell string may include a drain select transistor coupled with a bit line, and memory cells coupled with the drain select transistor. The page buffer may be coupled to the cell string through the bit line. The page buffer may include a latch and a first current path. The latch may store data of a value indicative of a result of a threshold voltage verification on the drain select transistor. The first current path may set a voltage of the bit line to a program inhibit voltage, based on the value of the data stored in the latch.

18 Claims, 18 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2020-0010018, filed on Jan. 28, 2020, which is incorporated herein by reference in its entirety.

BACKGROUND

Field of Invention

Various embodiments of the present disclosure relate to an electronic device, and more particularly, to a semiconductor memory device.

Description of Related Art

Generally, a memory device may have a two-dimensional structure in which strings are horizontally arranged on a semiconductor substrate, or a three-dimensional structure in which strings are vertically stacked on a semiconductor substrate. The three-dimensional memory device has been devised to overcome a limitation in the degree of integration of the two-dimensional memory device, and may include a plurality of memory cells which are vertically stacked on a semiconductor substrate.

SUMMARY

Various embodiments of the present disclosure are directed to a semiconductor memory device capable of programming a drain select transistor of a cell string.

An embodiment of the present disclosure may provide for a semiconductor memory apparatus including a cell string and a page buffer. The cell string may include a drain select transistor coupled with a bit line, and memory cells coupled with the drain select transistor. The page buffer may be coupled to the cell string through the bit line. The page buffer may include a latch and a first current path. The latch may store data of a value indicative of a result of a threshold voltage verification on the drain select transistor. The first current path may set a voltage of the bit line to a program inhibit voltage, based on the value of the data stored in the latch.

An embodiment of the present disclosure may provide for a semiconductor memory apparatus including a cell string, a latch, a bit line select transistor, a page buffer sensing transistor, a power supply transistor, and a voltage select circuit. The cell string may include a drain select transistor, and memory cells coupled with the drain select transistor. The latch may store data of a value indicative of a result of a threshold voltage verification on the drain select transistor. The bit line select transistor may be coupled to the drain select transistor. The page buffer sensing transistor may be coupled between the bit line select transistor and a first node. The power supply transistor may be coupled between a power supply and the first node. The voltage select circuit may supply a voltage of the power supply. The power supply transistor may be selectively turned on based on the value of the data stored in the latch so that the voltage of the power supply is supplied to the bit line as a program inhibit voltage.

An embodiment of the present disclosure may provide for a semiconductor memory apparatus including a cell string, a voltage supply circuit, a first control circuit and a second control circuit. The cell string includes a drain select transistor coupled to a bit line discharged before an initial period. The voltage supply circuit is configured to supply a first voltage during the initial period and a second voltage during a verify period. The first control circuit is configured to keep, when a threshold voltage of the drain select transistor is outside a range, the bit line discharged during the initial period. The second control circuit is configured to charge, when the threshold voltage is within the range, the bit line with the first voltage during the initial period and configured to charge the bit line with the second voltage during the verify period.

DETAILED DESCRIPTION

Specific structural and functional description provided herein is directed to embodiments of the present disclosure. The present invention, however, may be configured and carried out in various other ways. Thus, the present invention is not limited by or to the disclosed embodiments nor specific details thereof. Throughout the specification, reference to "an embodiment," "another embodiment" or the like is not necessarily to only one embodiment, and different references to any such phrase are not necessarily to the same embodiment(s).

Figure 1:
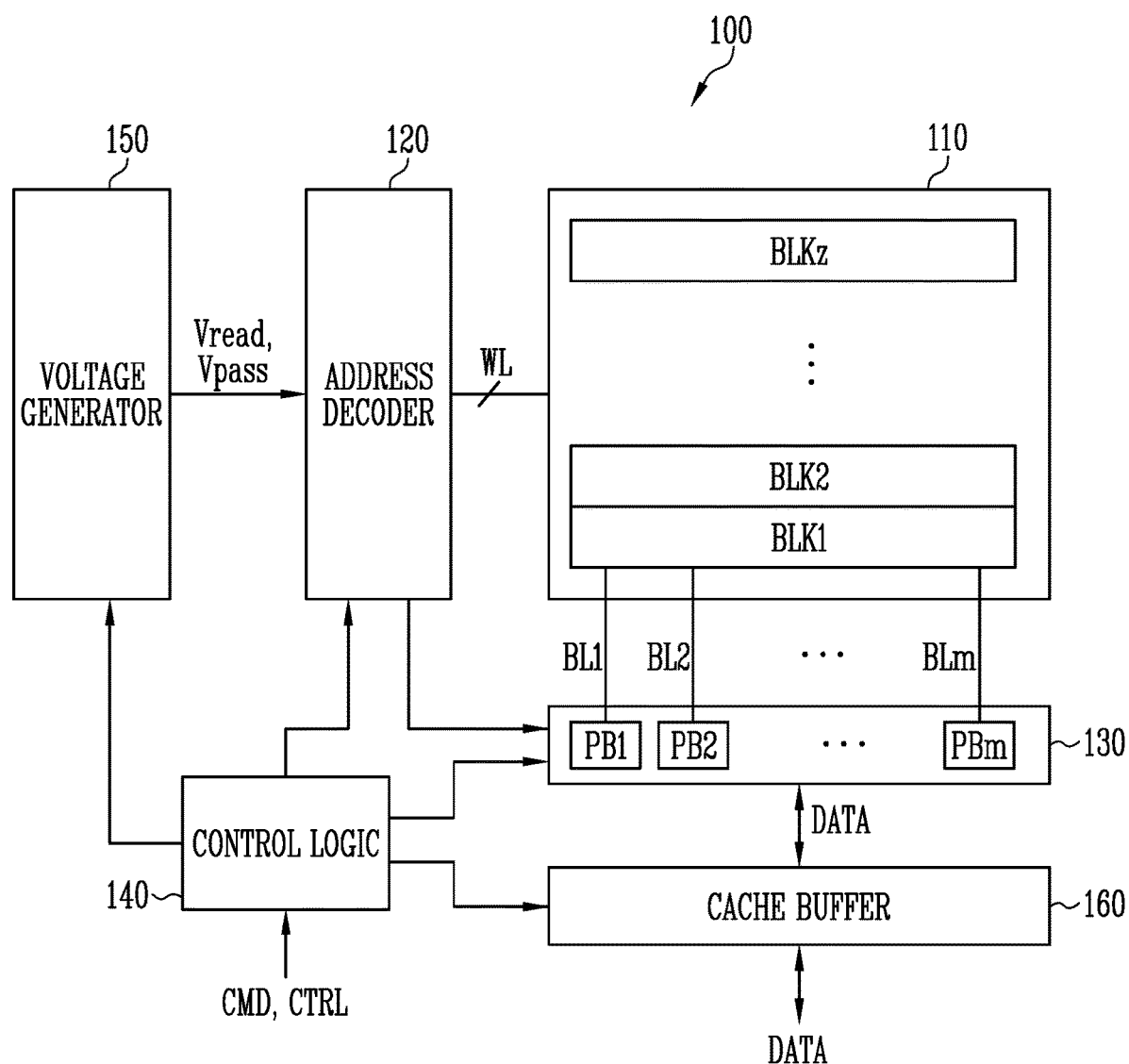
FIG. 1 is a diagram illustrating a semiconductor memory apparatus in accordance with an embodiment of the present disclosure.

FIG. 1 is a diagram illustrating a semiconductor memory apparatus 100 in accordance with an embodiment of the present disclosure.

Referring to FIG. 1, the semiconductor memory device 100 may include a memory cell array 110, an address decoder 120, a read/write circuit 130, control logic 140, a voltage generator 150, and a cache buffer 160.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells may be nonvolatile memory cells, which may have a vertical channel structure. The memory cell array 110 may be formed of a memory cell array having a two-dimensional structure. In another embodiment, the memory cell array 110 may be formed of a memory cell array having a three-dimensional structure. In an embodiment of the present disclosure, each of the memory blocks BLK1 to BLKz in the memory cell array 110 may include a plurality of sub-blocks. For example, each of the memory blocks BLK1 to BLKz may include two sub-blocks. In another example, each of the memory blocks BLK1 to BLKz may include four sub-blocks. However, the present invention is not limited to any particular number of sub-blocks per memory block. Each of the memory cells in the memory cell array may store at least one bit of data. For example, each of the memory cells in the memory cell array 110 may be a single-level cell (SLC), which stores 1-bit data, a multi-level cell (MLC), which stores 2-bit data, a triple-level cell (TLC), which stores 3-bit data, or a quad-level cell (QLC), which stores 4-bit data. In various embodiments, the memory cell array 110 may include a plurality of memory cells, each of which stores 5 or more bits of data.

The address decoder 120, the read/write circuit 130, and the voltage generator 150 may be collectively operated as a peripheral circuit for driving the memory cell array 110. The address decoder 120 is coupled to the memory cell array 110 through the word lines WL. The address decoder 120 may operate under control of the control logic 140.

The address decoder 120 may decode a block address among the received addresses. The address decoder 120 may select at least one memory block based on the decoded block address. When a read voltage application operation is performed during a read operation, the address decoder 120 may apply a read voltage Vread generated from the voltage generator 150 to a selected word line of a selected memory block and apply a pass voltage Vpass to the other unselected word lines. During a program verify operation, the address decoder 120 may apply a verify voltage generated from the voltage generator 150 to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 may select one memory block and one word line in response to a block address and a row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a node, a change in the amount of flowing current depending on a programmed state of a corresponding memory cell and latch it as sensing data. The read/write circuit 130 is operated in response to page buffer control signals outputted from the control logic 140.

During a read operation, the read/write circuit 130 may sense data of the memory cells and temporarily store readout data, and then output data DATA to the cache buffer 160 of the semiconductor memory device 100. In an embodiment, the read/write circuit 130 may include a column select circuit or the like as well as the page buffers (or page registers).

The control logic 140 is coupled to the address decoder 120, the read/write circuit 130, the cache buffer 160, and the voltage generator 150. The control logic 140 may receive a command CMD and a control signal CTRL. The control logic 140 may control overall operation of the semiconductor memory device 100 in response to the control signal CTRL. The control logic 140 may output a control signal for controlling the node precharge potential levels of the plurality of page buffers PB1 to PBm. The control logic 140 may control the read/write circuit 130 to perform a read operation of the memory cell array 110. The control logic 140 may control data transmission between the read/write circuit 130 and the cache buffer 160.

The voltage generator 150 generates a read voltage Vread and a pass voltage Vpass during a read operation in response to a voltage generator control signal outputted from the control logic 140.

The cache buffer 160 may receive data DATA from an external device of the semiconductor memory device 100, temporarily store the data DATA, and then transmit the data DATA to the read/write circuit 130. In an embodiment, the cache buffer 160 may receive data DATA for a program operation from an external controller of the semiconductor memory device 100, and transmit the received data DATA to the read/write circuit 130. The read/write circuit 130 may program the data DATA received from the cache buffer 160 to selected memory cells of the memory cell array 110.

The cache buffer 160 may temporarily store data DATA transmitted from the read/write circuit 130, and then transmit the data DATA to an external device of the semiconductor memory device 100. In an embodiment, the read/write circuit 130 may read data DATA stored in selected memory cells of the memory cell array 110. The data DATA read by the read/write circuit 130 may be temporarily stored in the cache buffer 160. The cache buffer 160 may transmit the read data received from the read/write circuit 130 to the controller.

Figure 2:
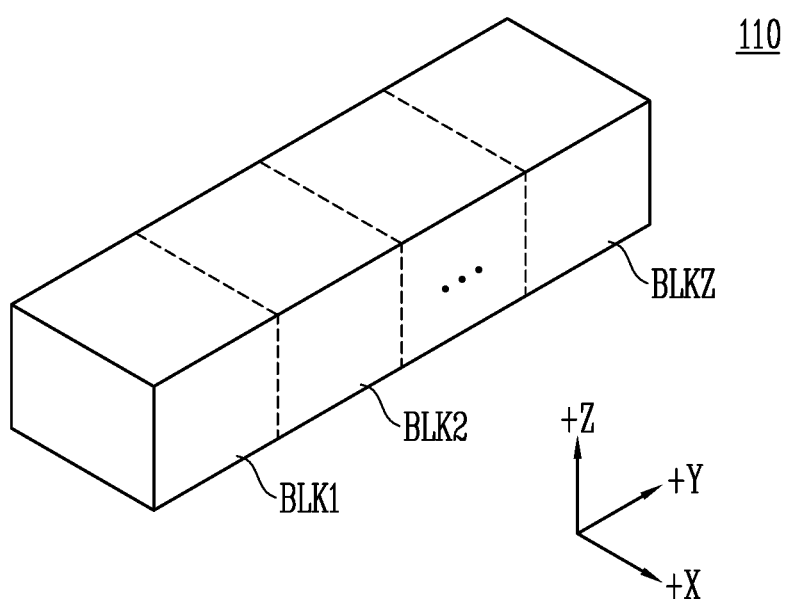
FIG. 2 is a block diagram illustrating an embodiment of a memory cell array, such as that of FIG. 1.

FIG. 2 is a block diagram illustrating an embodiment of the memory cell array 110 of FIG. 1.

Referring to FIG. 2, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block is described in more detail with reference to FIGS. 3 and 4.

Figure 3:
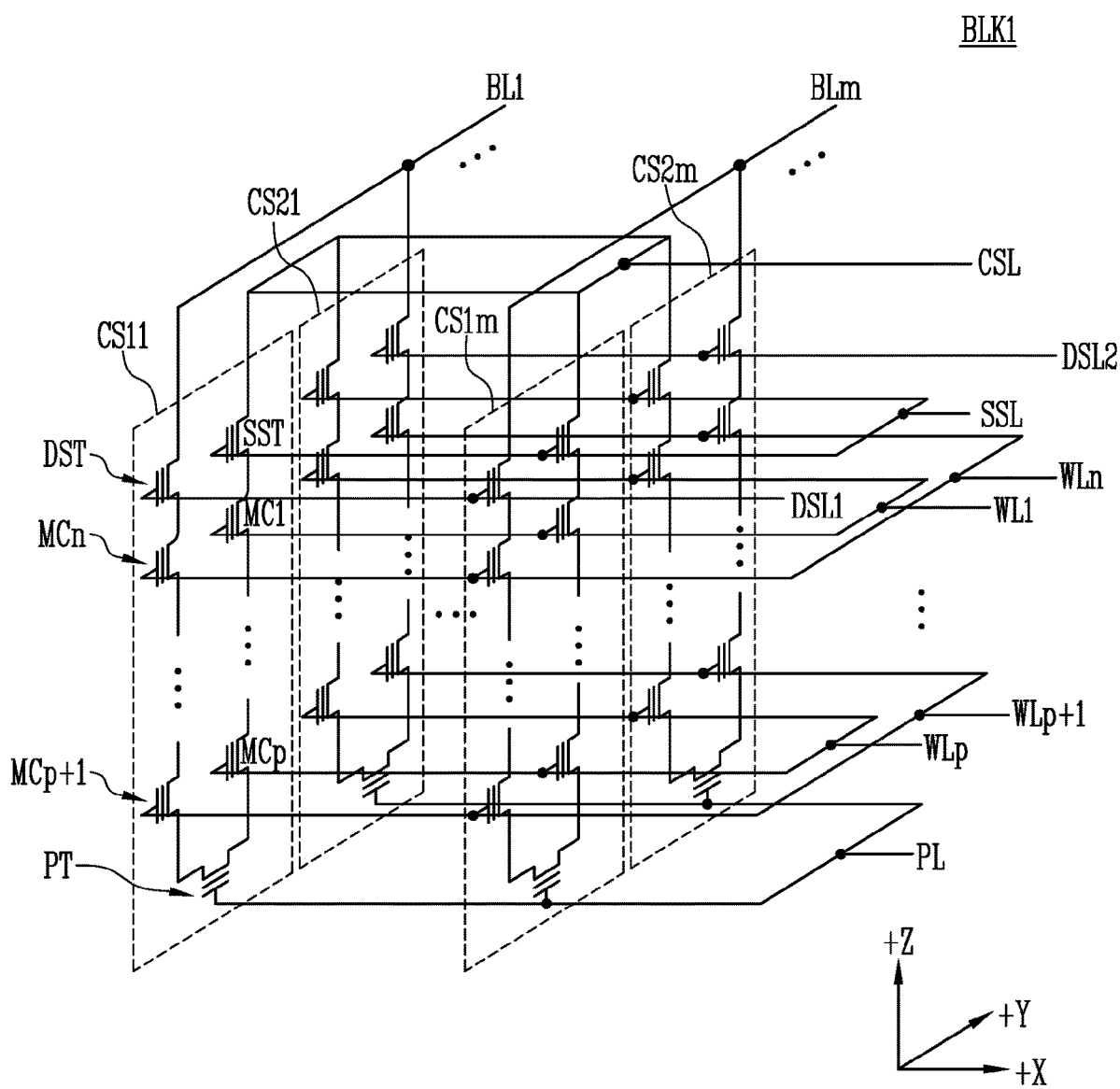
FIG. 3 is a circuit diagram illustrating an example of any one BLK1 of the memory blocks BLK1 to BLKz of FIG. 2.

FIG. 3 is a circuit diagram illustrating an example of any one BLK1 of the memory blocks BLK1 to BLKz of FIG. 2.

Referring to FIG. 3, the first memory block BLK1 includes a plurality of cell strings CS11 to CS1$m$ and CS21 to CS2$m$. In the first memory block BLK1, m cell strings are arranged in a row direction (i.e., the +X direction). The m cell strings arranged in the row direction are respectively coupled to the first to m-th bit lines BL1 to BLm. q (q is a natural number) cell strings are arranged in a column direction (i.e., the +Y direction). In FIG. 3, for clarity, there are illustrated only two cell strings arranged in the column direction, although more than two cell strings may be so arranged.

Each of the cell strings CS11 to CS1$m$ and CS21 to CS2$m$ is formed in a 'U' shape. Each of the cell strings CS11 to CS1$m$ and CS21 to CS2$m$ includes a pipe transistor PT, memory cells MC1 to MCn, a source select transistor SST, and a drain select transistor DST which are stacked on a substrate (not shown) provided in a lower portion of the memory block BLK1.

The select transistors SST and DST and the memory cells MC1 to MCn may have similar structures, respectively. For example, each of the select transistors SST and DST and the memory cells MC1 to MCn may include a channel layer, a tunneling insulating layer, a charge storage layer, and a blocking insulating layer coupled to a corresponding row line.

The source select transistor SST of each cell string is coupled between the common source line CSL and the memory cells MC1 to MCp. Respective gates of the source select transistors SST are coupled in common to a source select line SSL.

The first to n-th memory cells MC1 to MCn in each cell string are coupled between the source select transistor SST and the drain select transistor DST.

The first to n-th memory cells MC1 to MCn are divided into first to p-th memory cells MC1 to MCp and p+1-th to n-th memory cells MCp+1 to MCn. The first to p-th memory cells MC1 to MCp and the p+1-th to n-th memory cells MCp+1 to MCn are coupled to each other through the pipe transistor PT. The first to p-th memory cells MC1 to MCp are successively arranged in a −Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. Gates of the first to n-th memory cells MC1 to MCn are respectively coupled to first to n-th word lines WL1 to WLn.

Respective gates of the pipe transistors PT of the cell strings are coupled to a pipeline PL.

The drain select transistor DST of each cell string is coupled between the corresponding bit line and the memory cells MCp+1 to MCn. Drain select transistors DST of the cell strings CS11 to CS1$m$ in a first row are coupled to a first drain select line DSL1. Drain select transistors DST of the cell strings CS21 to CS2$m$ in a second row are coupled to a second drain select line DSL2.

In other words, cell strings (e.g., CS11 to CS1$m$) arranged in the same row (+X direction) are coupled to the same drain select line (e.g., DSL1) through the corresponding drain select transistors. Cell strings (e.g., CS11 and CS21) arranged in different rows are coupled to different drain select lines DSL1 and DSL2.

Figure 4:
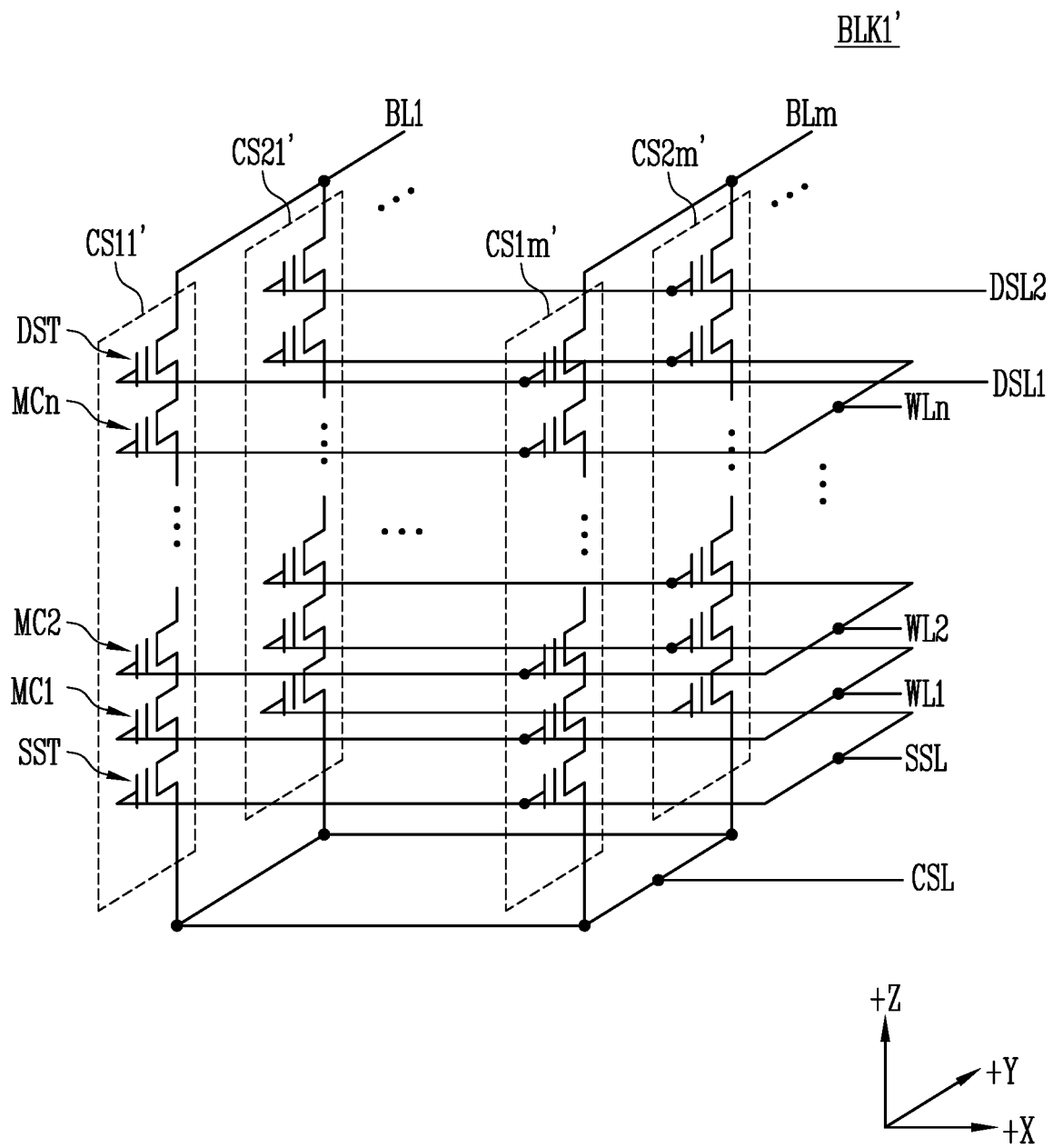
FIG. 4 is a circuit diagram illustrating an example of any one BLK1 of the memory blocks BLK1 to BLKz of FIG. 2.

FIG. 4 is a circuit diagram illustrating an example of any one BLK1 of the memory blocks BLK1 to BLKz of FIG. 2.

Referring to FIG. 4, a first memory block BLK1' includes a plurality of cell strings CS11' to CS1$m$' and CS21' to CS2$m$'. In the first memory block BLK1, m cell strings are arranged in a row direction (i.e., the +X direction). The m cell strings arranged in the row direction are respectively coupled to the first to m-th bit lines BL1 to BLm. q (q is a natural number) cell strings are arranged in a column direction (i.e., the +Y direction). In FIG. 4, for clarity, there are illustrated only two cell strings arranged in the column direction, although more than two cell strings may be so arranged.

Each of the cell strings CS11' to CS1$m$' and CS21' to CS2$m$' extends in the +Z direction. Each of the cell strings CS11' to CS1$m$' and CS21' to CS2$m$' includes a source select transistor SST, first to n-th memory cells MC1 to MCn, and a drain select transistor DST which are stacked on a substrate (not shown) provided in a lower portion of the memory block BLK1'.

The respective source select transistors SST of the cell strings are coupled in common to the common source line CSL. The source select transistor SST of each cell string is coupled between the common source line CSL and the memory cells MC1 to MCn. A gate of the source select transistor SST of each cell string is coupled to a source select line SSL.

The first to n-th memory cells MC1 to MCn in each cell string are coupled in series between the source select transistor SST and the drain select transistor DST. Memory cells disposed at the same height are coupled to the same word line. The first to n-th memory cells MC1 to MCn are respectively coupled to first to n-th word lines WL1 to WLn.

The drain select transistor DST of each cell string is coupled between the corresponding bit line and the memory cells MC1 to MCn. The drain select transistors of the cell strings arranged in the same row direction (+X direction) are coupled to the same drain select line. Drain select transistors DST of the cell strings CS11' to CS1$m$' in a first row are coupled to a first drain select line DSL1. Drain select transistors DST of the cell strings CS21 to CS2$m$ in a second row are coupled to a second drain select line DSL2.

Consequentially, the memory block BLK1' of FIG. 4 has an equivalent circuit similar to that of the memory block BLK1 of FIG. 3 except that a pipe transistor PT is excluded from each cell string.

In FIG. 4, the first to m-th cell strings CS11' to CS1$m$' or CS21' to CS2$m$' arranged in the row direction are respectively coupled to the first to m-th bit lines BL1 to BLm. In an embodiment, even bit lines and odd bit lines may be provided in lieu of the first to m-th bit lines BL1 to BLm. It will be understood that even number-th cell strings among the cell strings CS11' to CS1$m$' or CS21' to CS2$m$' arranged in the row direction are coupled to the respective even bit lines, and odd number-th cell strings among the cell strings CS11' to CS1$m$' or CS21' to CS2$m$' arranged in the row direction are coupled to the respective odd bit lines.

Figure 5:
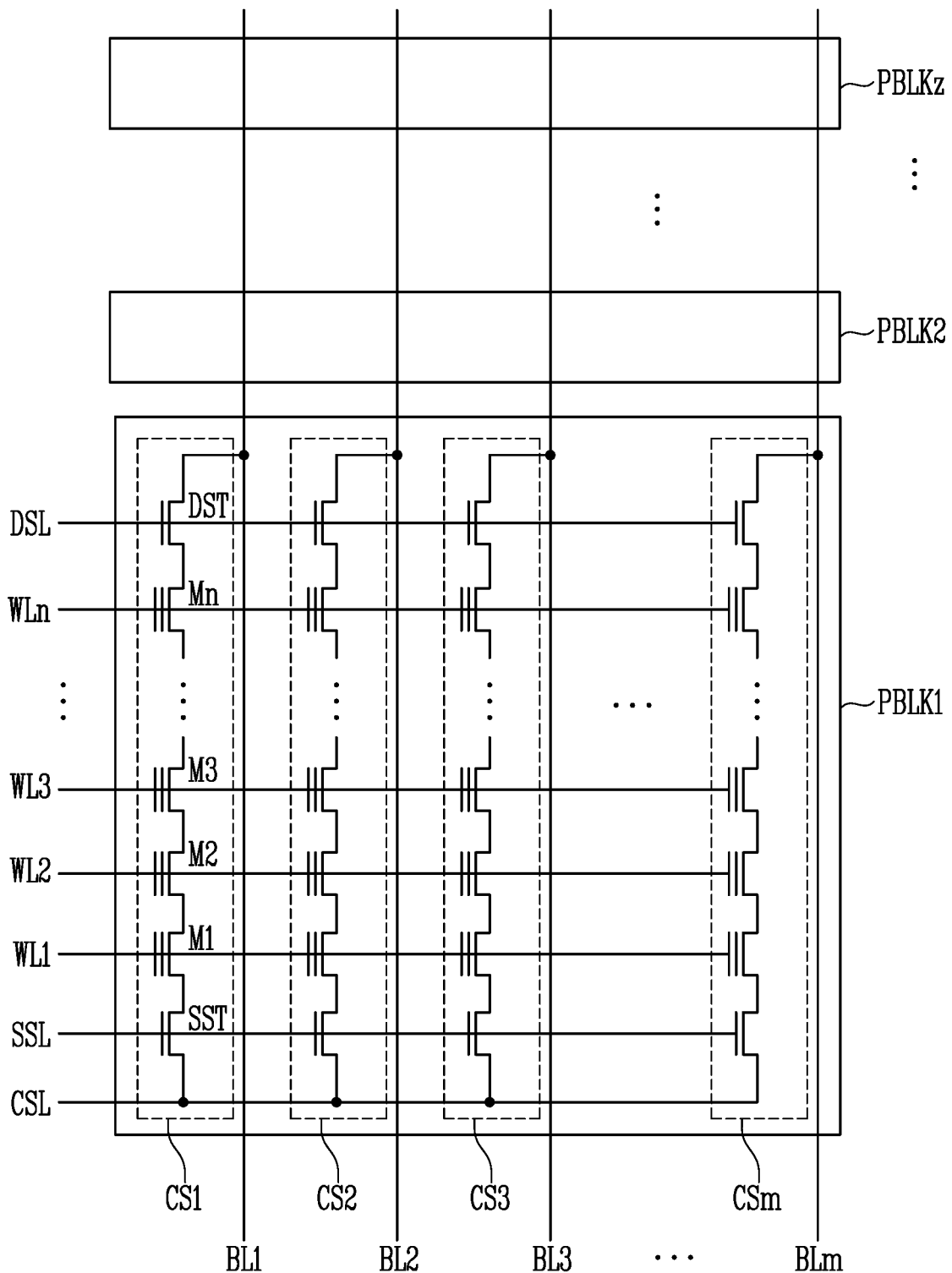
FIG. 5 is a block diagram illustrating an example of a memory cell array, such as that of FIG. 1.

FIG. 5 is a block diagram illustrating an example of the memory cell array 110 of FIG. 1.

The technical ideas of the present disclosure may be applied to a configuration in which the memory cells are arranged in a two-dimensional structure. Referring to FIG. 5, the memory cell array 110 may include a plurality of memory blocks PBLK1 to PBLKz. Each of the plurality of planar memory blocks PBLK1 to PBLKz may include first to m-th cell strings CS1 to CSm, which are respectively coupled to the first to m-th bit lines BL1 to BLm.

Each of the first to m-th cell strings CS1 to CSm may include a source select transistor SST, a plurality of memory cells MC1 to MCn, and a drain select transistor DST which are coupled in series to each other. The source select transistor SST is coupled to a source select line SSL. The first to n-th memory cells M1 to Mn are respectively coupled to first to n-th word lines WL1 to WLn. The drain select transistor DST is coupled to a drain select line DSL. A source of the source select transistor SST is coupled to a common source line CSL. A drain of the drain select transistor DST is coupled to the corresponding bit line. The source select line SSL, the first to n-th word lines WL1 to WLn, and the drain select line DSL are included in the row lines RL of FIG. 1. The source select line SSL, the first to n-th word lines WL1 to WLn, and the drain select line DSL are driven by the address decoder 120.

In an embodiment, the respective memory cells may be nonvolatile memory cells.

Figure 6:
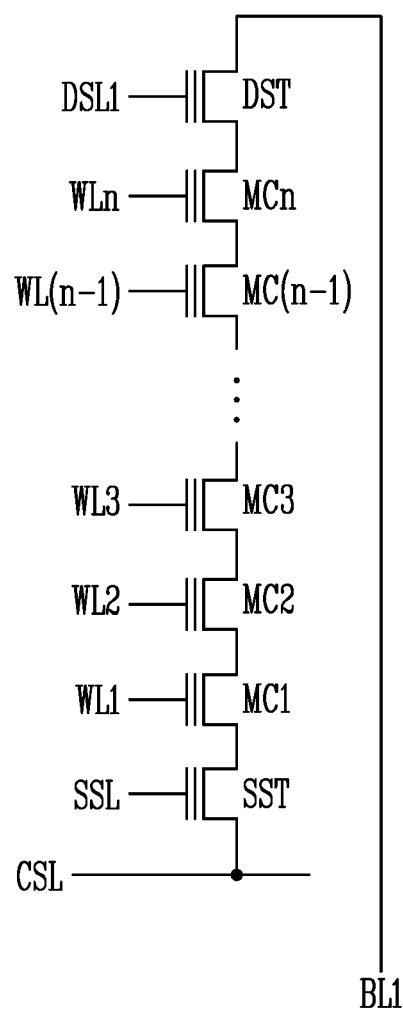
FIG. 6 is a circuit diagram of a cell string.

FIG. 6 is a circuit diagram of the cell string 115. The cell string 115 illustrated in FIG. 6 may be in the memory block illustrated in FIGS. 3 to 5. As illustrated in FIG. 6, the drain select transistor DST and the source select transistor SST that are included in each cell string may be formed of transistors having the same structure as that of the memory cells MC1 to MCn. The drain select transistor DST and the source select transistor SST may not be used to store data. Since the drain select transistor DST and the source select transistor SST have the same structure as that of the memory cells MC1 to MCn, the drain select transistor DST and the source select transistor SST each may include a channel layer, a tunneling insulating layer, a charge storage layer, and a blocking insulating layer coupled to a corresponding row line. Thus, the threshold voltages of the drain select transistor DST and the source select transistor SST may be determined depending on the amounts of charges trapped in the charge storage layers of the drain select transistor DST and the source select transistor SST, respectively.

To appropriately perform operations, i.e., a program operation, a read operation, and an erase operation, on memory cells included in the cell string 115, the threshold voltages of the drain select transistor DST and the source select transistor SST should remain in a set range. To adjust the threshold voltages of the drain select transistor DST and the source select transistor SST, a program operation or an erase operation may be performed on the drain select transistor DST and the source select transistor SST.

During a program operation on typical memory cells MC1 to MCn, depending on data to be stored in a specific memory cell and a threshold voltage state of the corresponding memory cell, the memory cell may have any one state of a program enable state and a program inhibit state.

For example, if the threshold voltage of the first memory cell MC1 is required to be increased during a program operation on a physical page including a first memory cell MC1, the first memory cell MC1 may be in the program enable state. In this case, the channel voltage of the first memory cell MC1 may be a program enable voltage. For instance, the program enable voltage may be a ground voltage. In the case where a program pulse is applied to the first word line WL1 while the first memory cell MC1 is in the program enable state, a difference between the gate voltage of the first memory cell MC1 and the channel voltage is relatively large. Therefore, electrons may be trapped in the charge storage layer of the first memory cell MC1, whereby the threshold voltage of the first memory cell MC1 may be increased.

For example, if there is no need to increase the threshold voltage of the first memory cell MC1 during a program operation on a physical page including a first memory cell MC1, the first memory cell MC1 may be in a program inhibit state. In this case, the channel voltage of the first memory cell MC1 may be a program inhibit voltage. In the case where a program pulse is applied to the first word line WL1 while the first memory cell MC1 is in the program inhibit state, a difference between the gate voltage of the first memory cell MC1 and the channel voltage is relatively low. Therefore, electrons may not be trapped in the charge storage layer of the first memory cell MC1. Hence, the threshold voltage of the first memory cell MC1 may be maintained as is.

During a program operation on a memory cell, if the memory cell included in a cell string is required to remain in the program inhibit state, a program inhibit voltage may be applied to the corresponding bit line. Hence, even if a turn-on voltage is applied to the drain select line DSL coupled with the drain select transistor, the program inhibit voltage may be applied to the bit line, whereby the drain select transistor DST may be turned off. In this case, the channel area of the cell string 115 may be self-boosted, so that the channel voltages of the memory cells MC1 to MCn may be increased. Consequently, all of the memory cells in the cell string 115 may be in the program inhibit state.

However, when the drain select transistor DST is required to be in the program inhibit state during the program operation on the drain select transistor DST, the self-boosting cannot be used because the drain select transistor DST is directly coupled to the bit line.

Therefore, during the program operation on the drain select transistor DST, the bit line voltage is required to be directly adjusted such that the drain select transistor DST remains in the program inhibit state.

Figure 7:
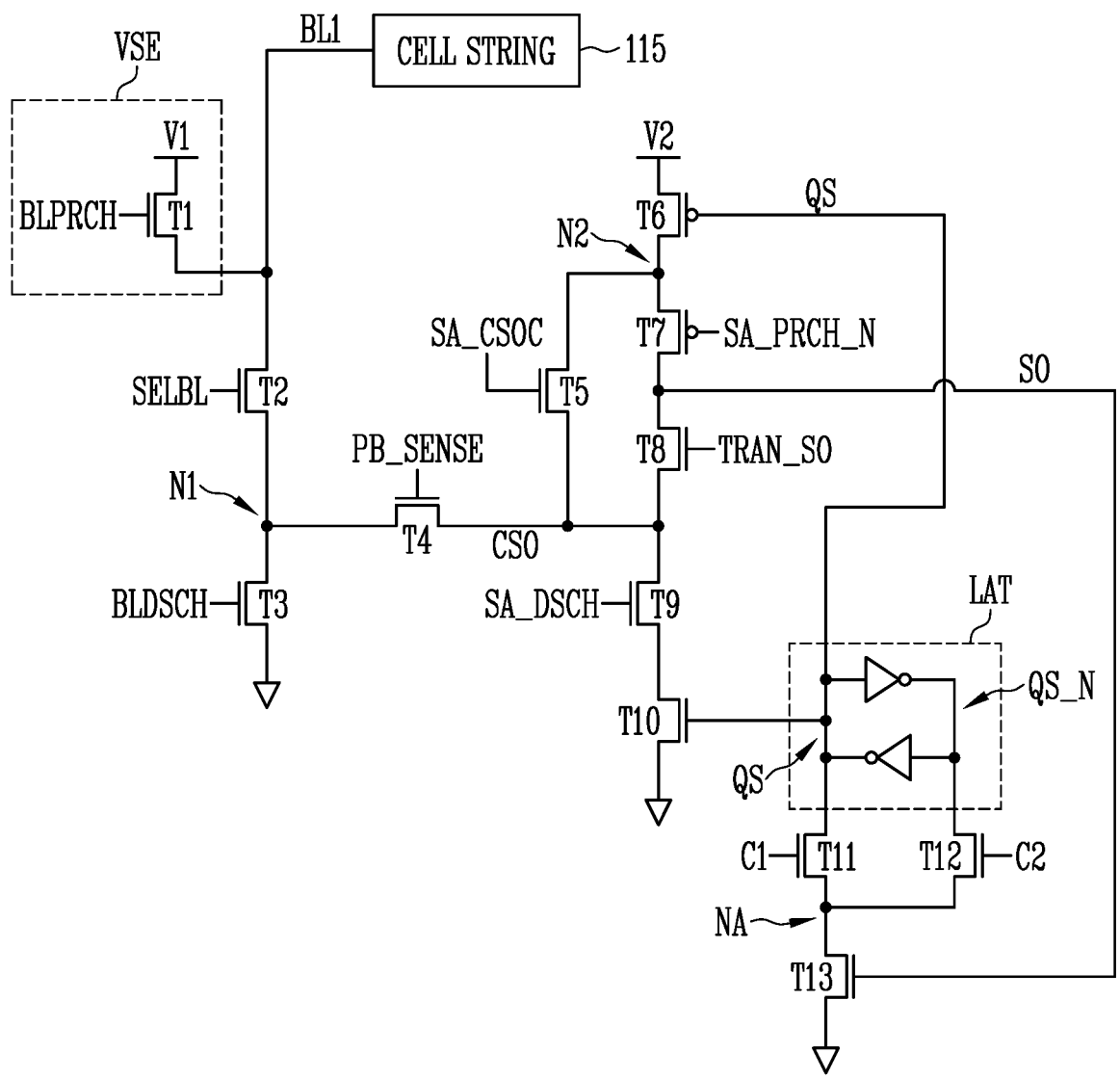
FIG. 7 is a circuit diagram illustrating the structure of a page buffer PB in accordance with an embodiment of the present disclosure.

FIG. 7 is a circuit diagram illustrating a structure of a page buffer PB in accordance with an embodiment of the present disclosure.

Referring to FIG. 7, the page buffer PB may be coupled to the cell string 115 through the bit line BL1. The page buffer PB may include first to thirteenth transistors T1 to T13.

The first transistor T1 may be coupled between a first power supply voltage V1 and the bit line BL1. The first transistor T1 may be controlled by a bit line precharge signal BLPRCH. The second transistor T2 may be coupled between the bit line BL1 and a node N1 and controlled by the bit line select signal SELBL. The third transistor T3 may be coupled between the node N1 and the ground and controlled by a bit line discharge signal BLDSCH. The fourth transistor T4 may be coupled between the node N1 and a node CSO and controlled by a page buffer sensing signal PB_SENSE.

The fifth transistor T5 may be coupled between a node N2 and the node CSO and controlled by a CSO control signal SA_CSOC. The sixth transistor T6 may be coupled between a second power supply V2 and the node N2 and controlled by a node (QS) voltage of a latch LAT. The seventh transistor T7 may be coupled between the node N2 and a node SO and controlled by a CSO precharge signal SA_P-

RCH_N. The eighth transistor T8 may be coupled between the node SO and the node CSO and controlled by an SO transmission signal TRAN_SO. The ninth transistor T9 and the tenth transistor T10 may be sequentially coupled between the node CSO and the ground. The ninth transistor T9 may be controlled by an SA discharge signal SA_DSCH. The tenth transistor T10 may be controlled by the node (QS) voltage of the latch LAT.

The eleventh transistor T11 may be coupled between the node QS of the latch LAT and a node NA and controlled by a first latch control signal C1. The twelfth transistor T12 may be coupled between a node QS_N of the latch LAT and the node NA and controlled by a second latch control signal C2. The thirteenth transistor T13 may be coupled between the node NA and the ground and controlled by a node (SO) voltage.

Referring to FIG. 7, the sixth and seventh transistors T6 and T7 may be PMOS transistors, and the other transistors may be NMOS transistors.

Referring to FIG. 7, the first power supply voltage V1 and the first transistor T1 may configure an external power supply VSE. The external power supply VSE may supply, to the bit line BL1, a program inhibit voltage to make the drain select transistor DST enter the program inhibit state. To this end, the first power supply voltage V1 may be an external high voltage to be applied to a separate pad. The bit line precharge signal BLPRCH may control the first transistor T1 so that the first power supply voltage V1 is supplied to the bit line BL1 to make the drain select transistor DST of the cell string 115 enter the program inhibit state.

Figure 8A:
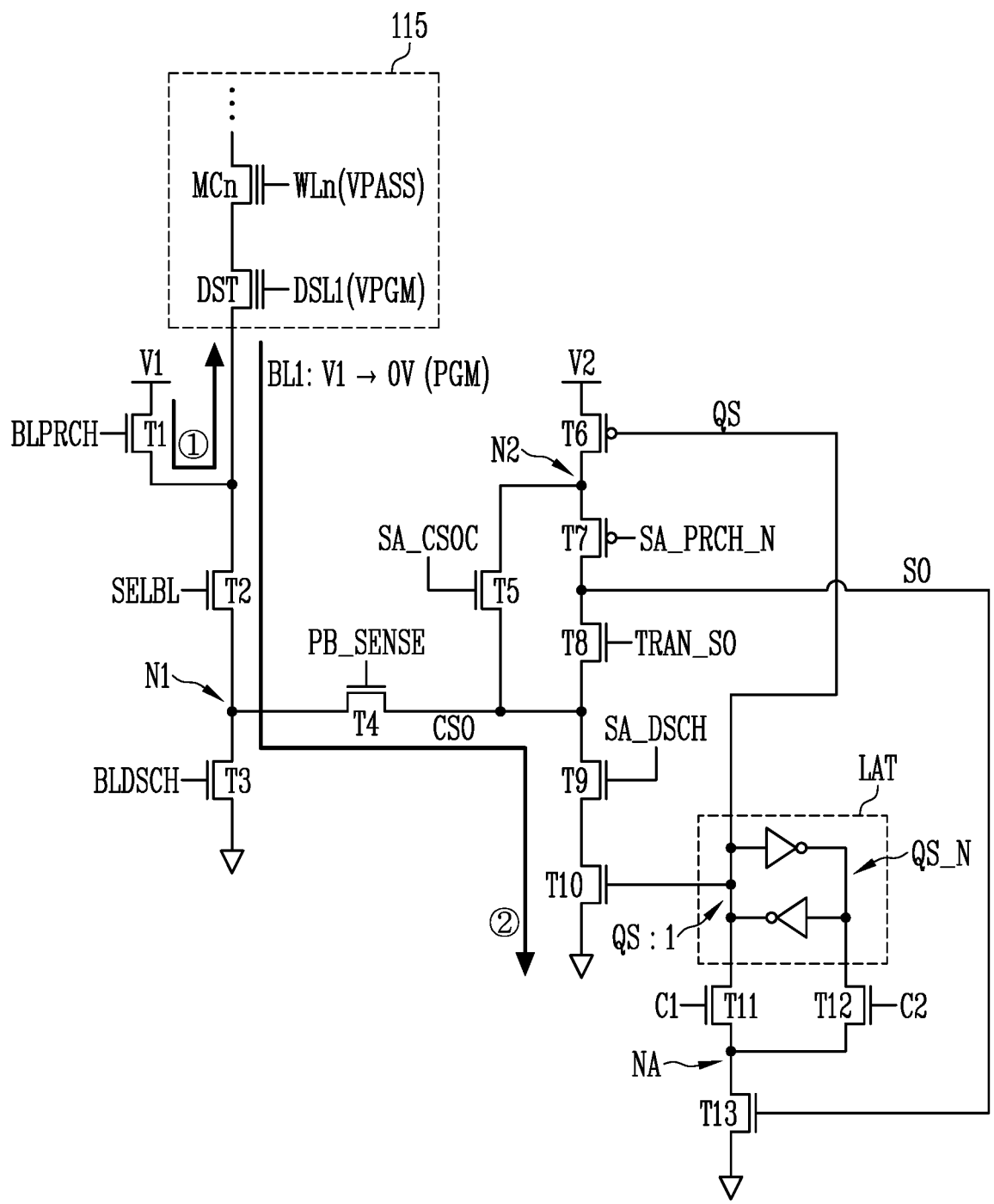
FIGS. 8A and 8B are diagrams illustrating an operation of a page buffer, such as that shown in FIG. 7.
Figure 8B:
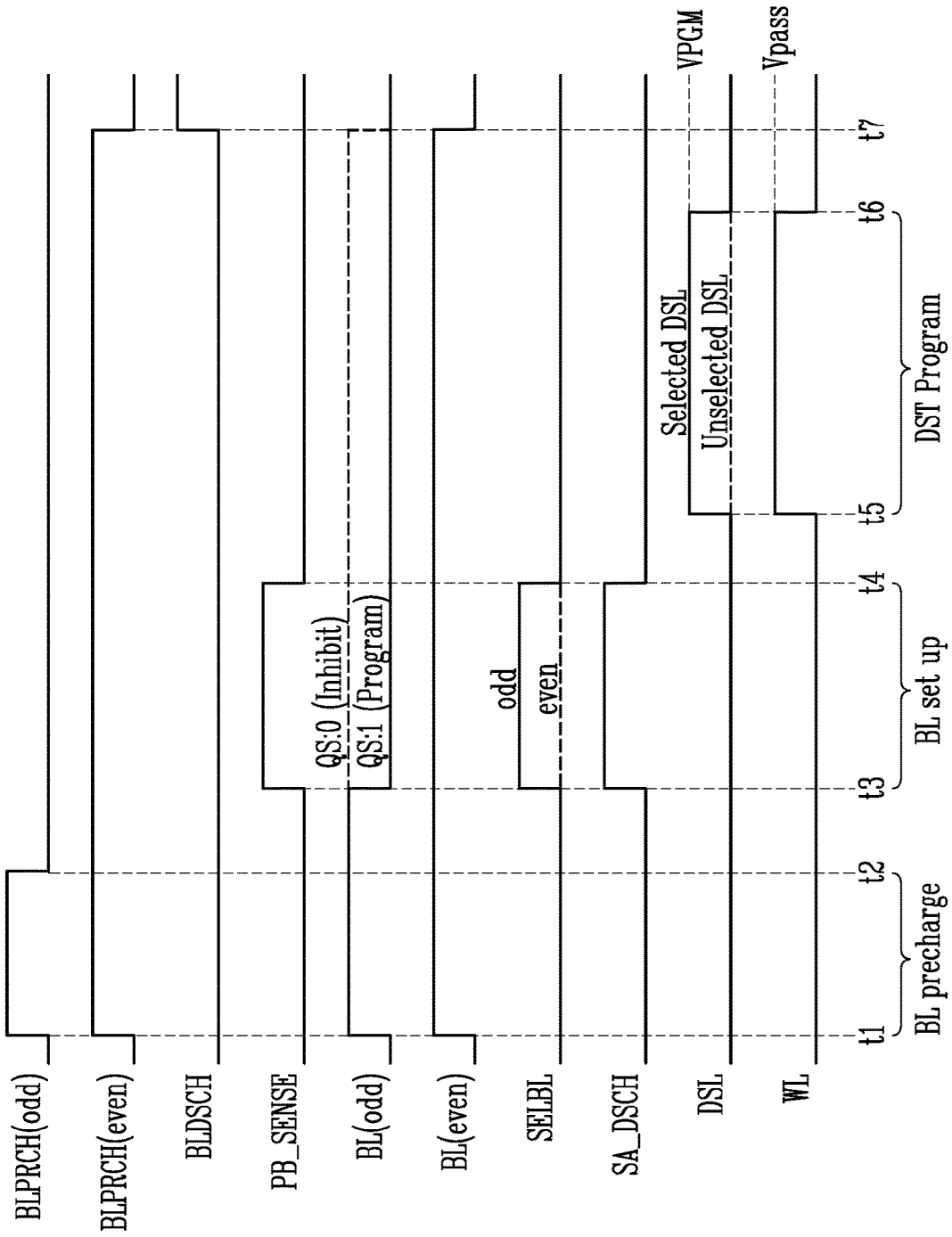

FIGS. 8A and 8B are diagrams illustrating operation of the page buffer described with reference to FIG. 7. In detail, FIG. 8A is a diagram illustrating an operation of making the drain select transistor DST enter either the program enable state or the program inhibit state based on data of the latch LAT during a program operation on the drain select transistor DST of the cell string 115. FIG. 8B is a timing diagram illustrating a program operation on the drain select transistor DST based on the operation illustrated in FIG. 8A.

Referring FIG. 8A, the bit line BL1 may be precharged using the first power supply voltage V1 (①). To this end, the first transistor T1 may be turned on, and the second transistor T2 may be turned off. Consequently, the voltage of the bit line BL1 may be precharged to the first power supply voltage V1.

Thereafter, the voltage of the bit line BL1 may be set up based on the data stored in the latch LAT. The latch LAT may store a result of a threshold voltage verify operation on the drain select transistor DST. Therefore, it may be determined, depending on the data stored in the latch LAT, whether or not to increase the threshold voltage of the drain select transistor DST. During the program operation, the threshold voltage of the drain select transistor DST may be verified, and a result of the verification may be stored in the latch LAT.

For example, in the case where the result of the threshold voltage verify operation indicates failure, there is a need to further increase the threshold voltage of the drain select transistor DST. Therefore, in this case, a bit value of "1" may be stored in the latch LAT. In the case where the bit value of "1" is stored in the latch LAT, the voltage of the node QS may indicate a logical value of "1". The voltage indicated by "1" may be a relatively high voltage and be a voltage for turning on the tenth transistor T10 and turning off the sixth transistor T6.

In the case where the result of the threshold voltage verify operation indicates that the verification has passed, this means that the threshold voltage of the drain select transistor DST is sufficiently high so that there is no longer need to program the drain select transistor DST. Hence, the drain select transistor DST is required to be in the program inhibit state. In the case where, as the result of the threshold voltage verify operation, the threshold voltage of the drain select transistor DST is sufficiently high, data of a first value may be stored in the latch LAT. In an embodiment, the first value may be a bit value of "0". In the case where a bit value of "0" is stored in the latch LAT, the voltage of the node QS may be indicative of "0". That is, the voltage indicated by "0" may be a relatively low voltage to turn off the tenth transistor T10 and turn on the sixth transistor T6. The bit value convention used herein, of course, may be reversed. That is, in the above situation "1" may be used to indicate a relatively low voltage and "0" may be used to indicate a relatively high voltage.

FIG. 8A illustrates an operation when data of a second value is stored in the latch LAT. In an embodiment, the second value may be a bit value of "1". Reversing the logic convention, the second value may be "0". In the embodiment of FIG. 8A, since the bit value of "1" is stored in the latch LAT, the voltage of the node QS, which is indicative of "1", is able to turn on the tenth transistor T10. In addition, in the case where the second transistor T2, the fourth transistor T4, and the ninth transistor T9 are turned on, a current path may be formed between the bit line BL1 and the ground. Hence, the voltage of the bit line BL1 may be discharged and thus have a value of 0V. In other words, in the case where the bit value of "1" is stored in the latch LAT, the voltage of the bit line BL1 that has been precharged to the first power supply voltage V1 may be reduced to 0V. Since the voltage of the bit line BL1 has been reduced to 0V, the drain select transistor DST may be in the program enable state. Thereafter, if a program voltage is applied to the drain select line DSL, the threshold voltage of the drain select transistor DST may be increased.

Although not illustrated in FIG. 8A, if the bit value of "0" is stored in the latch LAT, the voltage of the node QS is indicative of "0". In this case, the tenth transistor T10 may be turned off. Even if the second transistor T2, the fourth transistor T4, and the ninth transistor T9 are turned on, the current path between the bit line BL1 and the ground may be blocked. Consequently, the voltage of the bit line BL1 may be maintained at the first power supply voltage V1. In other words, in the case where the bit value of "0" is stored in the latch LAT, the voltage of the bit line BL1 that has been precharged to the first power supply voltage V1 may be maintained. Since the voltage of the bit line BL1 is maintained at the first power supply voltage V1, the drain select transistor DST may be in the program inhibit state. Thereafter, even if a program voltage is applied to the drain select line DSL, the threshold voltage of the drain select transistor DST may not be increased.

FIG. 8B is a timing diagram illustrating a method of performing a program operation on the drain select transistor DST by odd strings and even strings. FIG. 8B illustrates a process of performing a program operation on the drain select transistor DST of a cell string coupled to odd bit lines.

Referring to FIG. 8B, at time t1, a bit line precharge signal BLPRCH(odd) of a page buffer coupled with an odd bit line may be enabled to a high level. At time t1, a bit line precharge signal BLPRCH(even) of a page buffer coupled with an even bit line may also be enabled to the high level.

Hence, the odd bit line BL(odd) and the even bit line BL(even) may be enabled by the first power supply voltage V1. At time t2, the bit line precharge signal BLPRCH(odd) of the page buffer coupled with the odd bit line may be disabled to a low level.

At time t3, the page buffer sensing signal PB_SENSE may be enabled to the high level. At time t3, a bit line select signal SELBL of the page buffer coupled with the odd bit line may be enabled to the high level. At time t3, a bit line select signal SELBL of the page buffer coupled with the even bit line may remain in the low level. At time t3, an SA_discharge signal SA_DSCH may be enabled to the high level.

Since at time t3 the bit line select signal SELBL of the page buffer coupled with the even bit linen remains in the low level, the voltage of the even bit line BL(even) may be maintained at the first power supply voltage V1. In the case of the page buffer coupled with the odd bit line BL(odd), all of the second transistor T2, the fourth transistor T4, and the ninth transistor T9 (illustrated in FIG. 8A) may be turned on. Thereby, the bit line voltage may be changed or maintained depending on the value stored in the latch LAT of the page buffer PB coupled with the odd bit line BL(odd).

As described above, in the case where the bit value of "1" is stored in the latch LAT, the voltage of the node QS is indicative of "1". Hence, at time t3, the tenth transistor T10 may be turned on. Therefore, the voltage of the odd bit line BL(odd) may be discharged and thus have a value of 0V. In the case where the bit value of "0" is stored in the latch LAT, the voltage of the node QS is indicative of "0". Consequently, the voltage of the odd bit line BL(odd) may be maintained at the first power supply voltage V1.

At time t4, the page buffer sensing signal PB_SENSE, the bit line select signal SELBL of the page buffer coupled with odd bit line, and the SA_discharge signal SA_DSCH may be disabled to the low level. Thereby, the connection between the cell string 115 and the page buffer may be interrupted.

Thereafter, at time t5, a program voltage VPGM may be applied to a selected drain select line DSL, and the voltage of an unselected drain select line DSL may be maintained at 0 V. Furthermore, a program pass voltage Vpass may be applied to the word lines WL coupled to the cell string 115. The drain select line DSL illustrated in FIG. 8B may be a drain select line DSL1 illustrated in FIG. 6. The word line WL illustrated in FIG. 8B may correspond to any of the first to n-th word lines WL1 to WLn illustrated in FIG. 6.

Since the voltage of a bit line having the program inhibit state among the odd bit lines BL(odd) is maintained at the first power supply voltage V1, the drain select transistor DST of the cell string coupled with the corresponding bit line may not be programmed. Since the voltage of the bit line having the program enable state among the odd bit lines BL(odd) has been reduced to 0V, the drain select transistor DST of the cell string coupled with the corresponding bit line may be programmed.

Since all of the even bit lines BL(even) are maintained at the first power supply voltage V1, the drain select transistor DST of the cell string coupled with the corresponding bit line may not be programmed.

Thereafter, at time t6, the program voltage VPGM applied to the drain select line DSL may be interrupted, and the program pass voltage Vpass applied to the word line WL may be interrupted. At time t7, the bit line discharge signal BLDSCH may be enabled to the high level. Thereby, the voltages of all of the bit lines may be discharged to 0 V.

In FIG. 8B, a period from t1 to t2 may correspond to a bit line (BL) precharge period, a period from t3 to t4 may correspond to a BL set-up period, and a period from t5 to t6 may correspond to a drain select transistor (DST) program period.

Although FIG. 8B illustrates a process of performing a program operation on the drain select transistor DST of the cell string coupled with the odd bit lines, a process of performing a program operation on the drain select transistor DST of a cell string coupled with the even bit lines may also be performed in a manner similar to that of the cell string coupled with the odd bit lines.

In the page buffer described with reference to FIGS. 7 to 8B, the BL precharge period and the BL set-up period may be separate, in which case the respective operations thereof are performed separately, as illustrated in FIG. 8B. This may lead to an increase in the time it takes to perform a program operation on the drain select transistor.

In a page buffer in accordance with an embodiment of the present disclosure, the BL precharge period and the BL set-up period may be integrated with each other. In addition, the external power supply VSE may be removed, and the drain select transistor DST may remain in the program inhibit state based on the second power supply voltage V2.

Figure 9:
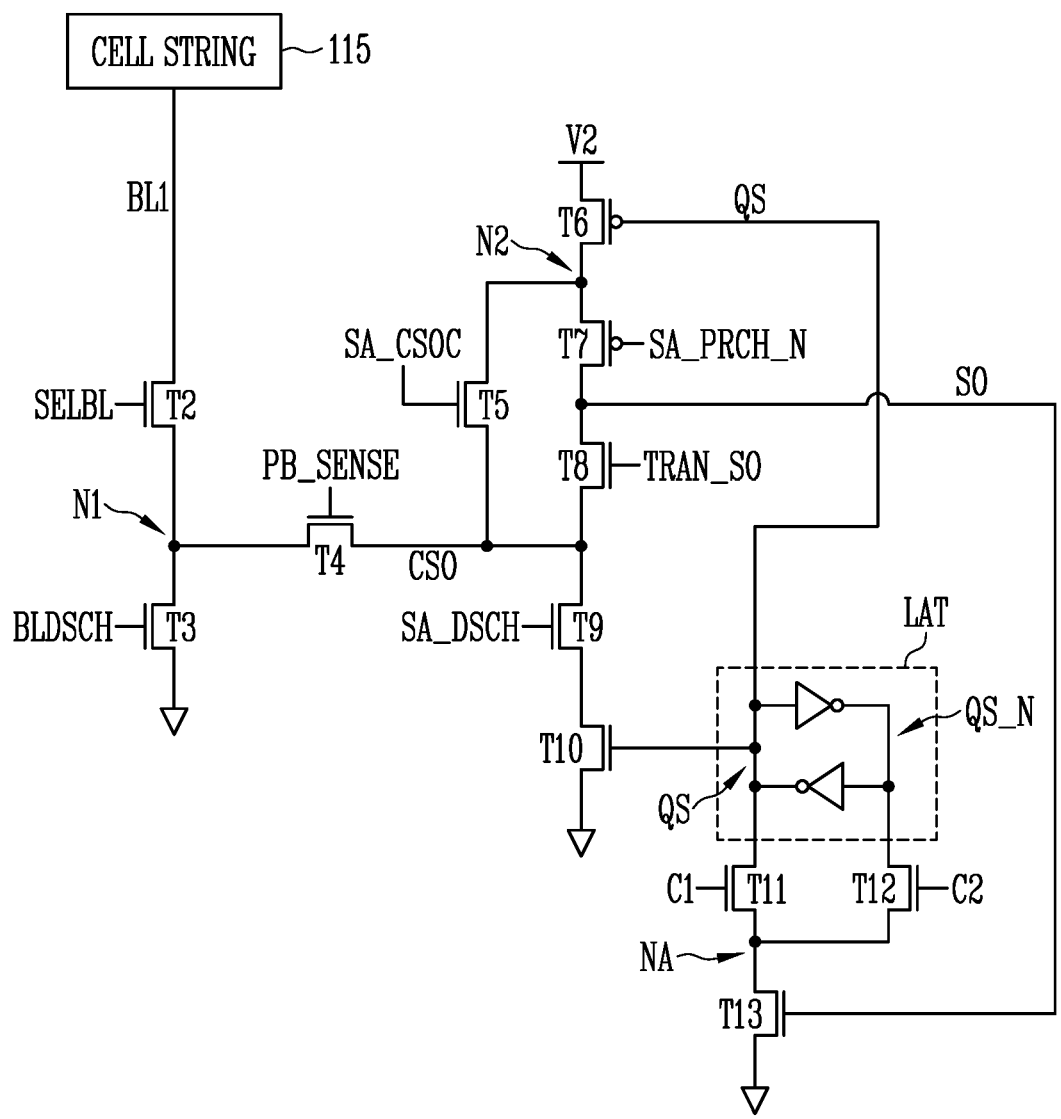
FIG. 9 is a circuit diagram illustrating a structure of a page buffer PB in accordance with an embodiment of the present disclosure.

FIG. 9 is a circuit diagram illustrating a structure of a page buffer PB in accordance with an embodiment of the present disclosure. Referring to FIG. 9, the page buffer PB may be coupled to the cell string 115 through the bit line BL1. The page buffer PB may include second to thirteenth transistors T2 to T13.

The second (bit line select) transistor T2 may be coupled between the bit line BL1 and the node N1 and controlled by the bit line select signal SELBL. The third (bit line discharge) transistor T3 may be coupled between the node N1 and the ground and controlled by a bit line discharge signal BLDSCH. The fourth (page buffer sensing) transistor T4 may be coupled between the node N1 and a node CSO and controlled by a page buffer sensing signal PB_SENSE.

The fifth transistor T5 may be coupled between a node N2 and the node CSO and controlled by a CSO control signal SA_CSOC. The sixth (power supply) transistor T6 may be coupled between a second power supply V2 and the node N2 and controlled by a node (QS) voltage of a latch LAT. The seventh (SO node precharge) transistor T7 may be coupled between the node N2 and a node SO and controlled by a CSO precharge signal SA_PRCH_N. The eighth (SO node transmission) transistor T8 may be coupled between the node SO and the node CSO and controlled by an SO transmission signal TRAN_SO. The ninth SO (sensing node discharge) transistor T9 and the tenth transistor T10 may be sequentially coupled between the node CSO and the ground. The SO sensing node discharge transistor T9 may be controlled by an SA discharge signal SA_DSCH. The tenth (latch transmission) transistor T10 may be controlled by the node (QS) voltage of the latch LAT.

The eleventh (latch set) transistor T11 may be coupled between the node QS of the latch LAT and a node NA and controlled by a first latch control signal C1. The twelfth (latch reset) transistor T12 may be coupled between a node QS_N of the latch LAT and the node NA and controlled by a second latch control signal C2. The thirteenth (SO masking) transistor T13 may be coupled between the node NA and the ground and controlled by a node (SO) voltage.

Referring to FIG. 9, the sixth and seventh transistors T6 and T7 may be PMOS transistors, and the other transistors may be NMOS transistors.

Compared to the embodiment of FIG. 7, the page buffer of FIG. 9 may not include the first transistor T1 of FIG. 7.

The configuration of the page buffer of FIG. 9 other than the first transistor T1 may be the same as that of the page buffer of FIG. 7.

Figure 10A:
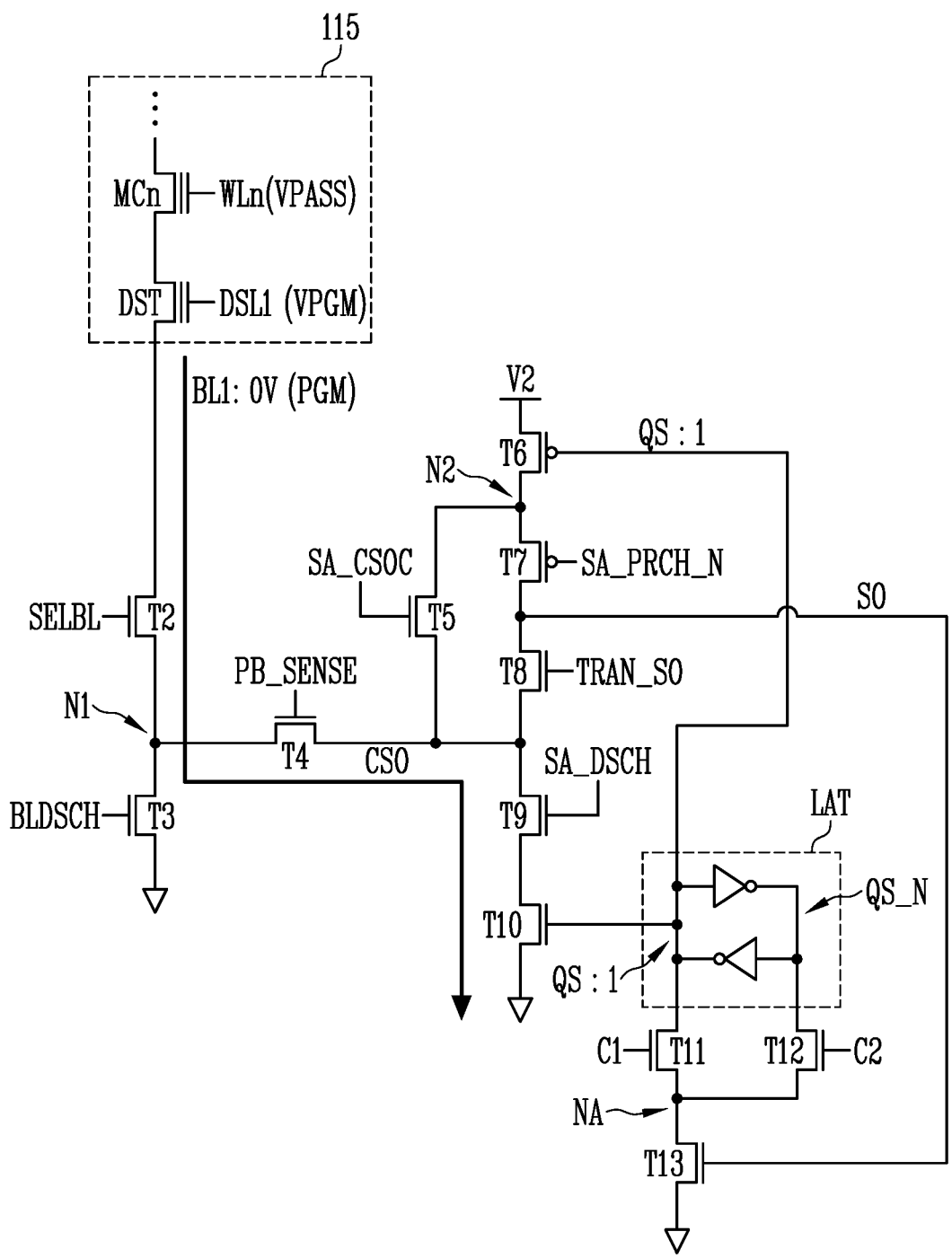
FIGS. 10A and 10B are diagrams illustrating a bit line set-up operation of a page buffer, such as that shown in FIG. 9.
Figure 10B:
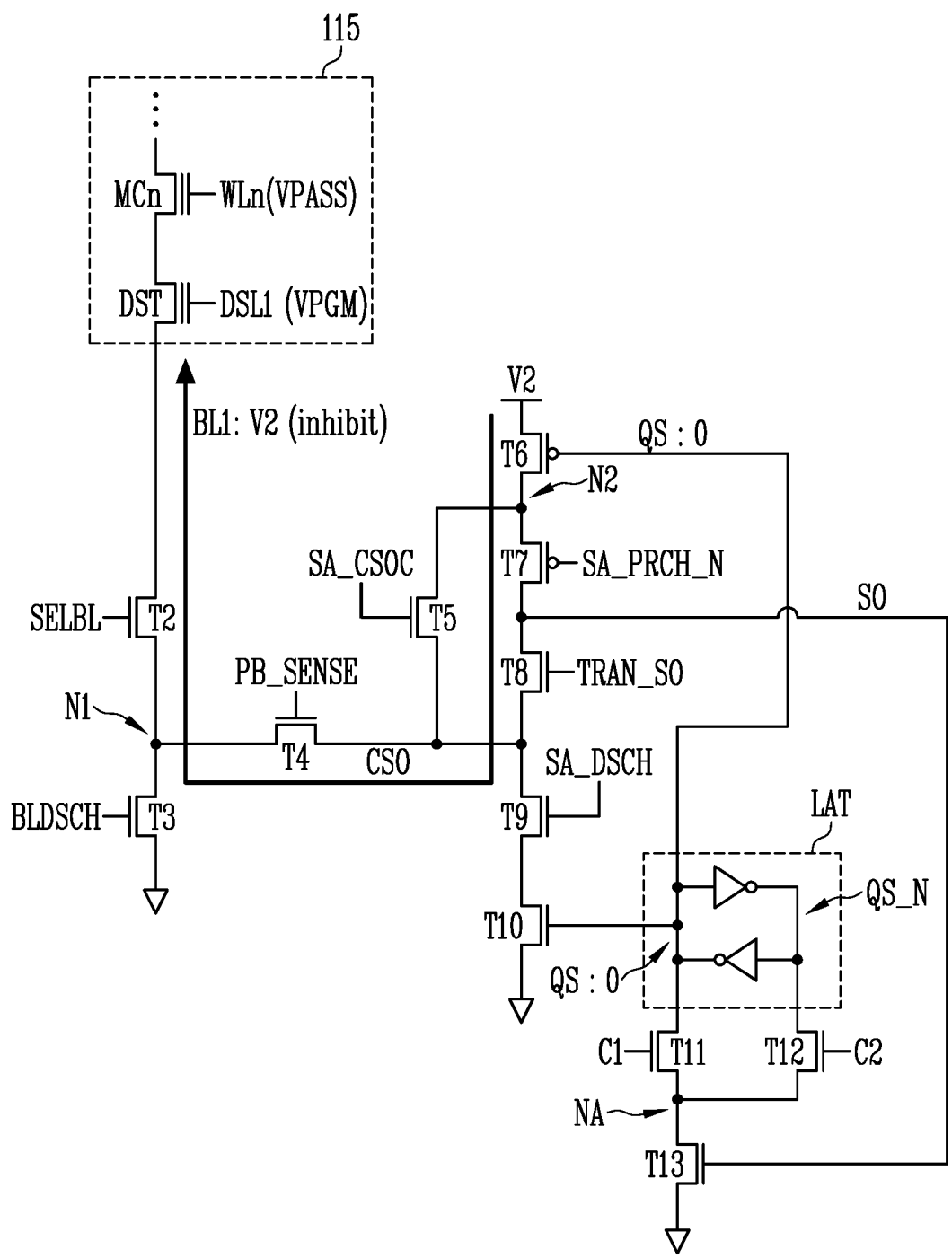

FIGS. 10A and 10B are diagrams illustrating a bit line set-up operation of the page buffer described with reference to FIG. 9. In an embodiment, a first value stored in the latch may be a bit value of "0", and is a second value may be a bit value of "1". In another embodiment, this bit convention may be reversed.

FIG. 10A illustrates an operation when the second value is stored in the latch LAT. FIG. 10B illustrates an operation when the first value is stored in the latch LAT.

In detail, FIG. 10A illustrates a bit line set-up operation of the page buffer when a bit of "1" is stored in the latch LAT. FIG. 10B illustrates a bit line set-up operation of the page buffer when a bit of "0" is stored in the latch LAT.

Referring to FIG. 10A, since the bit value of "1" is stored in the latch LAT, the voltage of the node QS is indicative of "1". Thereby, the tenth transistor T10 may be turned on. In addition, in the case where the second transistor T2, the fourth transistor T4, and the ninth transistor T9 are turned on, a current path may be formed between the bit line BL1 and the ground. Hence, the voltage of the bit line BL1 may be discharged and thus have a value of 0V. Since the voltage of the bit line BL1 becomes 0V, the drain select transistor DST may be in the program enable state. Thereafter, if a program voltage is applied to the drain select line DSL, the threshold voltage of the drain select transistor DST may be increased.

Referring to FIG. 10B, since the bit value of "0" is stored in the latch LAT, the voltage of the node QS may is indicative of "0". In this case, the tenth transistor T10 may be turned off. Even if the second transistor T2, the fourth transistor T4, and the ninth transistor T9 are turned on, the current path between the bit line BL1 and the ground may be blocked.

Since the voltage of the node QS is indicative of the logical value of "0", the sixth transistor T6 may be turned on. In addition, in the case where the second transistor T2, the fourth transistor T4, and the seventh transistor T7, and the eighth transistor T8 are turned on, a current path may be formed between the bit line BL1 and the second power supply V2. Consequently, the voltage of the first bit line BL1 may be precharged to the second power supply voltage V2. The second power supply voltage V2 may be sufficient to keep the drain select transistor DST in the program inhibit state. Thereafter, even if a program voltage is applied to the drain select line DSL, the drain select transistor DST may not be programmed.

Figure 11:
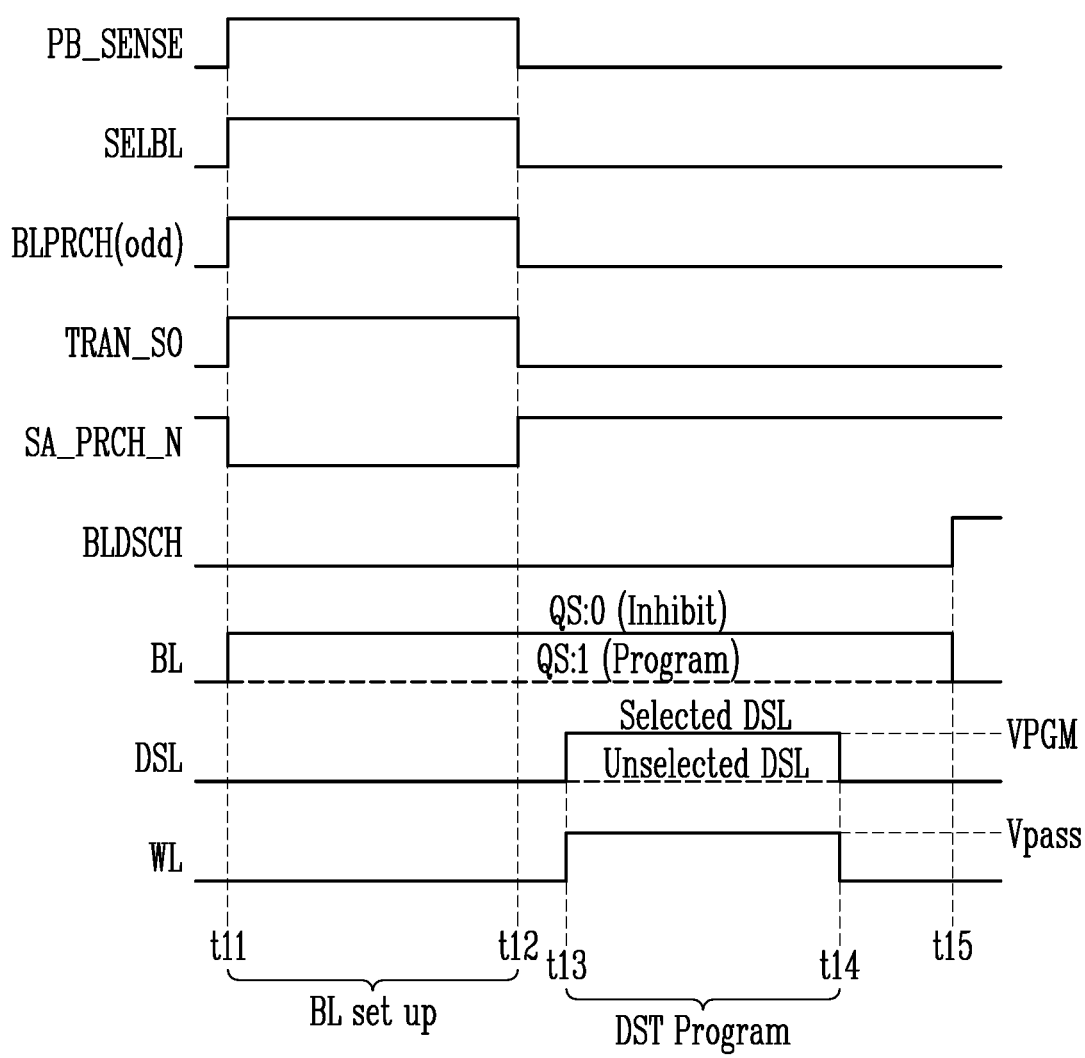
FIG. 11 is a timing diagram illustrating a program operation of a drain select transistor DST based on the operation shown in FIGS. 10A and 10B.

FIG. 11 is a timing diagram illustrating a program operation of the drain select transistor DST based on the operation described with reference to FIGS. 10A and 10B. FIG. 11 illustrates a method of programming the drain select transistor on cell strings coupled with all of the bit lines without distinction between the odd bit lines and the even bit lines.

Referring to FIG. 11, at time t11, the page buffer sensing signal PB_SENSE, the bit line select signal SELBL, the SO transmission signal TRAN_SO, and the SA discharge signal SA_DSCH may be enabled to the high level. Furthermore, at time t11, the SA precharge signal SA_PRCH_N may be enabled to the low level. Thereby, at time t11, the fourth transistor T4, the second transistor T2, the eighth transistor T8, the ninth transistor T9, and the seventh transistor T7 may be turned on.

Hence, in the case where the bit value of "1" is stored in the latch LAT, the voltage of the bit line BL may become 0V, as illustrated in FIG. 10A. On the other hand, in the case where the bit value of "0" is stored in the latch LAT, the voltage of the bit line BL may become the second power supply voltage V2, as illustrated in FIG. 10B.

Thereafter, at time t12, the page buffer sensing signal PB_SENSE, the bit line select signal SELBL, the SO transmission signal TRAN_SO, and the SA discharge signal SA_DSCH may be disabled to the low level. Furthermore, at time t12, the SA precharge signal SA_PRCH_N may be disabled to the high level.

Thereafter, at time t13, a program voltage VPGM may be applied to a selected drain select line DSL, and the voltage of an unselected drain select line DSL may be maintained at 0 V. Furthermore, a program pass voltage Vpass may be applied to the word lines WL coupled to the cell string 115. The drain select line DSL illustrated in FIG. 11 may be a drain select line DSL1 illustrated in FIG. 6. The word line WL illustrated in FIG. 11 may correspond to any of the first to n-th word lines WL1 to WLn illustrated in FIG. 6.

Since the voltage of a bit line having a program inhibit state is a second power supply voltage V2, the drain select transistor DST of a cell string coupled with the corresponding bit line may not be programmed. Since the voltage of a bit line having a program enable state is 0 V, the drain select transistor DST of a cell string coupled with the corresponding bit line may be programmed.

Thereafter, at time t14, the program voltage VPGM applied to the drain select line DSL may be interrupted, and the program pass voltage Vpass applied to the word line WL may be interrupted. At time t15, the bit line discharge signal BLDSCH may be enabled to the high level. Thereby, the voltages of all of the bit lines may be discharged to 0 V.

In FIG. 11, a period from t11 to t12 may correspond to a bit line (BL) set up period, and a period from t13 to t14 may correspond to a period of programming the drain select transistor DST.

Referring to FIG. 11 along with FIG. 8B, the DST program operation of FIG. 11 needs only the bit line set up period, while the bit line precharge period as well as the bit line set-up period are required to be separately provided in the DST program operation of FIG. 8B. Therefore, according to the embodiment illustrated in FIGS. 9 to 11, a program time of the drain select transistor may be reduced. In the case of the embodiment illustrated in FIG. 9, the circuit may be further simplified because the external power supply VSE illustrated in FIG. 7 is not needed.

Referring to FIGS. 9 to 11, the second power supply voltage V2 may be used in a program inhibit operation of the drain select transistor DST. Although not illustrated in FIGS. 9 to 11, the second power supply voltage V2 may be used in a verify operation of the drain select transistor DST. According to the embodiment illustrated in FIGS. 9 to 11, the second power supply voltage may be used in both the program inhibit operation and the verify operation of the drain select transistor DST.

The voltage causing the drain select transistor DST to enter the program inhibit state may be a relatively high voltage. The voltage that is used in the verify operation of the drain select transistor DST may be a relatively low voltage. Therefore, in the case where the second power supply voltage V2 is used in both the program inhibit operation and the verify operation of the drain select transistor DST, inefficiency may result. For example, if the second power supply voltage V2 is a relatively high voltage, the program inhibit operation of the drain select transistor DST may be smoothly performed, but the power consumption in the verify operation may be increased. On the other hand, if the second power supply voltage V2 is a relatively low voltage, the power consumption in the verify operation may be minimized, but the program inhibit operation of the drain select transistor DST may not be reliably performed, so that the threshold voltage of the drain select transistor DST may be undesirably increased. This may lead to deterioration in the threshold voltage distribution of the drain select transistors DST.

Figure 12A:
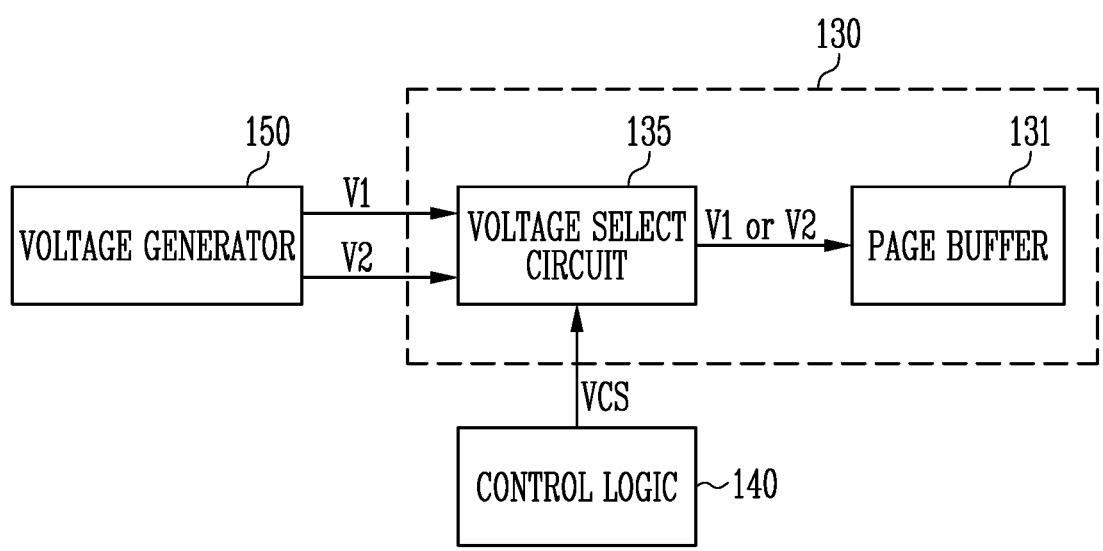
FIG. 12A is a block diagram illustrating a semiconductor memory device in accordance with an embodiment of the present disclosure.

FIG. 12A is a block diagram illustrating a semiconductor memory device in accordance with an embodiment of the present disclosure. Referring to FIG. 12A, the semiconductor memory device may include a read/write circuit 130, control logic 140, and a voltage generator 150. The read/write circuit 130 may include a page buffer 131 and a voltage select to circuit 135. The voltage generator 150 and the control logic 140 of FIG. 12A may respectively be the same components as the voltage generator 150 and the control logic 140 illustrated in FIG. 1. Although not illustrated in FIG. 1, the voltage select circuit 135 of FIG. 12A may be included in the read/write circuit 130, and a plurality of voltage select circuits 135 may be coupled with respective page buffers. In other words, the number of voltage select circuits 135 may be the same as the number of page buffers PB1 to PBm included in the read/write circuit 130. For clarity, FIG. 12A illustrates one voltage select circuit 135 and the page buffer 131 corresponding thereto.

The voltage generator 150 may generate the first power supply voltage V1 and the second power supply voltage V2 and transmit them to the voltage select circuit 135. The control logic 140 may generate a voltage select control signal VCS for controlling the operation of the voltage select circuit 135 and transmit the voltage select control signal VCS to the voltage select circuit 135. The voltage select circuit 135 may select the first power supply voltage V1 or the second power supply voltage V2 based on the voltage select control signal VCS, and transmit the selected voltage V1 or V2 to the page buffer 131. An example of the voltage select circuit 135 is described with reference to FIG. 13.

Figure 12B:
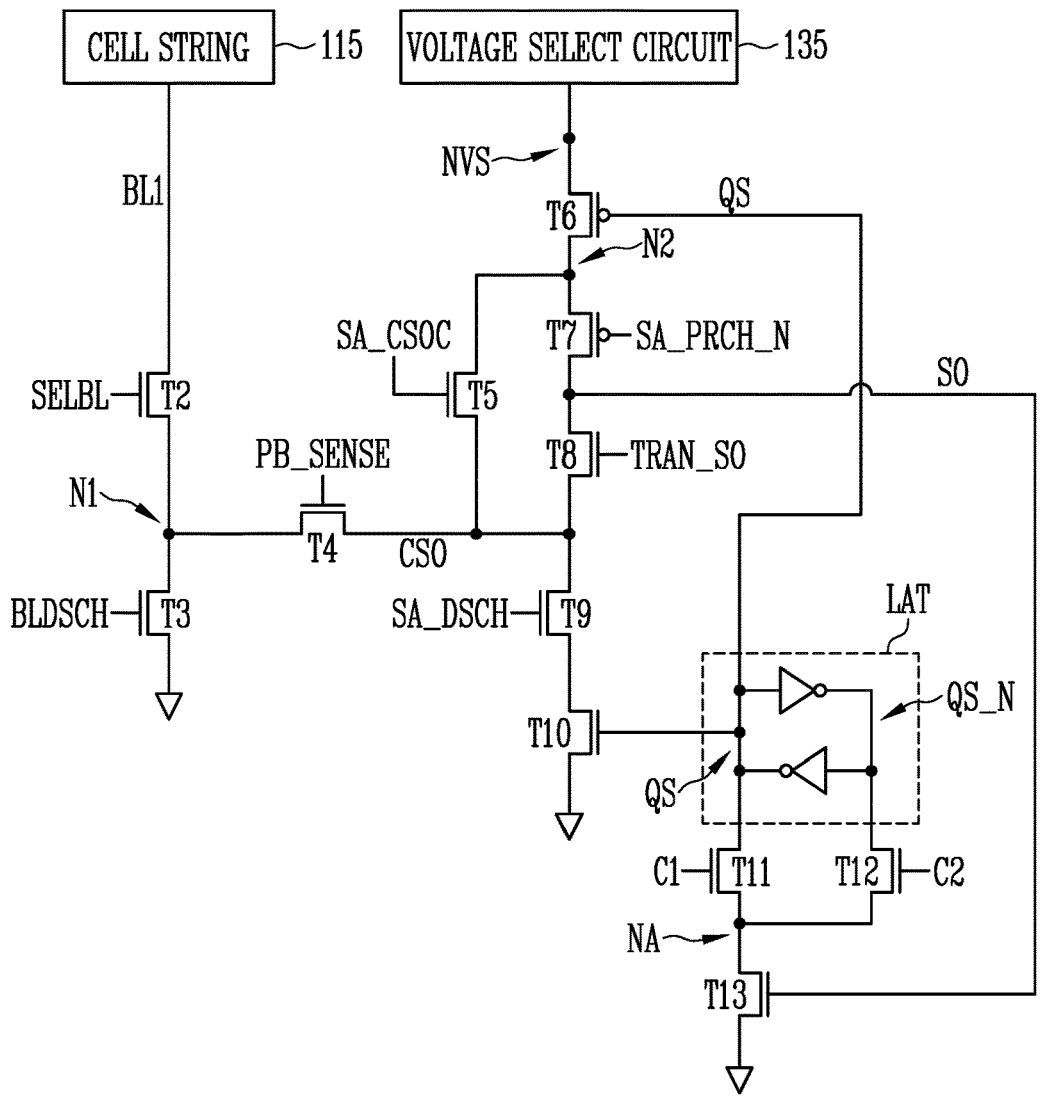
FIG. 12B is a circuit diagram illustrating structures of a voltage select circuit and a page buffer, such as those of FIG. 12A.

FIG. 12B is a circuit diagram illustrating the structures of the voltage select circuit 135 and the page buffer 131 of FIG. 12A. Referring to FIG. 12B, the page buffer may be coupled to the cell string 115 through the bit line BL1. The page buffer may include second to thirteenth transistors T2 to T13. Furthermore, the page buffer may be coupled with the voltage select circuit 135 through a node NVS.

The second transistor T2 may be coupled between the bit line BL1 and the node N1 and controlled by the bit line select signal SELBL. The third transistor T3 may be coupled between the node N1 and the ground and controlled by a bit line discharge signal BLDSCH. The fourth transistor T4 may be coupled between the node N1 and a node CSO and controlled by a page buffer sensing signal PB_SENSE.

The fifth transistor T5 may be coupled between a node N2 and the node CSO and controlled by a CSO control signal SA_CSOC. The sixth transistor T6 may be coupled between the node NVS and the node N2 and controlled by a node (QS) voltage of a latch LAT. The seventh transistor T7 may be coupled between the node N2 and a node SO and controlled by a CSO precharge signal SA_PRCH_N. The eighth transistor T8 may be coupled between the node SO and the node CSO and controlled by an SO transmission signal TRAN_SO. The ninth transistor T9 and the tenth transistor T10 may be sequentially coupled between the node CSO and the ground. The ninth transistor T9 may be controlled by an SA discharge signal SA_DSCH. The tenth transistor T10 may be controlled by the node (QS) voltage of the latch LAT.

The eleventh transistor T11 may be coupled between the node QS of the latch LAT and a node NA and controlled by a first latch control signal C1. The twelfth transistor T12 may be coupled between a node QS_N of the latch LAT and the node NA and controlled by a second latch control signal C2. The thirteenth transistor T13 may be coupled between the node NA and the ground and controlled by a node (SO) voltage.

The voltage select circuit 135 may be coupled with the sixth transistor T6 through the node NVS.

Referring to FIG. 12B, the sixth and seventh transistors T6 and T7 may be PMOS transistors, and the other transistors may be NMOS transistors.

Unlike the embodiment of FIG. 9 in which the sixth transistor T6 is coupled to the second power supply V2, the sixth transistor T6 may be coupled to the voltage select circuit 135 in the embodiment of FIG. 12B. The voltage select circuit 135 may supply different power supply voltages to the node NVS during the program operation and the verify operation of the drain select transistor to solve the above-mentioned problem described in connection with FIG. 9. Thereby, the program operation and the verify operation of the drain select transistor may be optimized.

An example of the voltage select circuit 135 illustrated in FIG. 12B is described below with reference to FIGS. 13 and 14.

Figure 13:
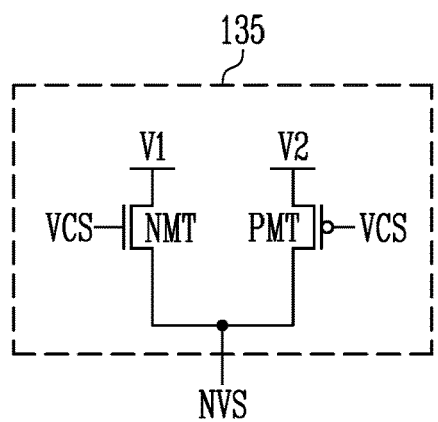
FIG. 13 is a diagram illustrating an example of a voltage select circuit, such as that illustrated in FIGS. 12A and 12B.

FIG. 13 is a diagram illustrating an example of the voltage select circuit 135 illustrated in FIGS. 12A and 12B. Referring to FIG. 13, the voltage select circuit 135 may include an NMOS transistor NMT and a PMOS transistor PMT. The NMOS transistor NMT and the PMOS transistor PMT may be controlled by the voltage select control signal VCS. In the case where the voltage select control signal VCS has a high level, the NMOS transistor NMT may be turned on, and the PMOS transistor PMT may be turned off. In this case, the first power supply voltage V1 may be supplied to the node NVS. In the case where the voltage select control signal VCS has a low level, the NMOS transistor NMT may be turned off, and the PMOS transistor PMT may be turned on. In this case, the second power supply voltage V2 may be supplied to the node NVS. During the program operation of the drain select transistor DST, the high level voltage select control signal VCS may be applied. During the verify operation of the drain select transistor DST, the low level voltage select control signal VCS may be applied. Thereby, the program operation and the verify operation of the drain select transistor may be optimized.

Figure 14:
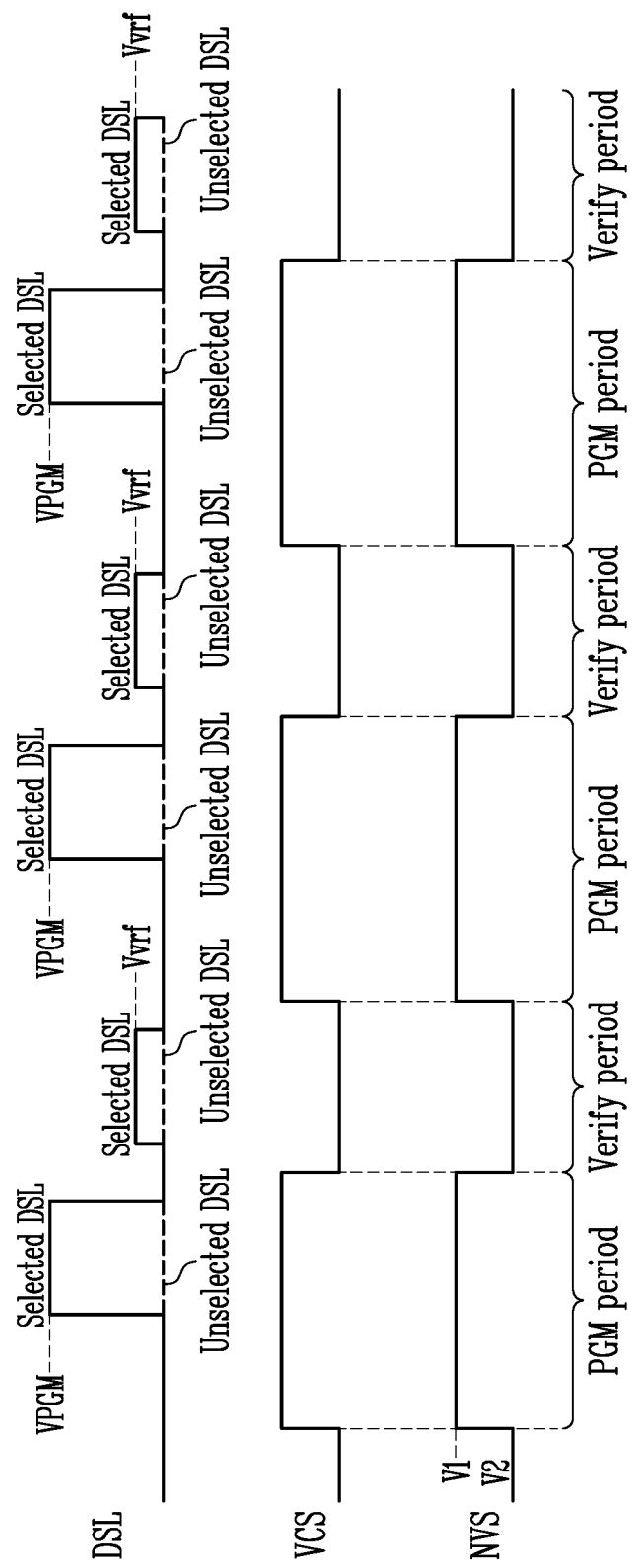
FIG. 14 is a timing diagram illustrating a program operation and a verify operation of a page buffer including a voltage select circuit, such as that illustrated in FIG. 13.

FIG. 14 is a timing diagram illustrating a program operation and a verify operation of a page buffer including the voltage select circuit illustrated in FIG. 13.

Referring to FIG. 14, there are illustrated an application voltage of the drain select line DSL, a voltage select control signal VCS, and the voltage of the node NVS during a program period and a verify period of the drain select transistor, the operations of which are repeatedly performed over multiple cycles.

During the program period of the drain select transistor, a program pulse VPGM may be applied to a selected drain select line DSL, and the voltage select signal VCS may be controlled to be at the high level. Hence, the first power supply voltage V1 that is a relatively high voltage may be supplied to the node NVS.

During the verify period of the drain select transistor, a verify voltage Vvrf may be applied to the selected drain select line DSL, and the voltage select signal VCS may be controlled to be at the low level. Hence, the second power supply voltage V2 that is a relatively low voltage may be supplied to the node NVS.

According to the page buffer in accordance with the embodiment illustrated in FIG. 14, the first power supply voltage V1 that is the high voltage may be supplied to the node NVS during the program operation of the drain select transistor DST, and the second power supply voltage V2 that is the low voltage may be applied to the node NVS during the verify operation of the drain select transistor DST. Thereby, the program operation and the verify operation of the drain select transistor may be optimized.

Figure 15:
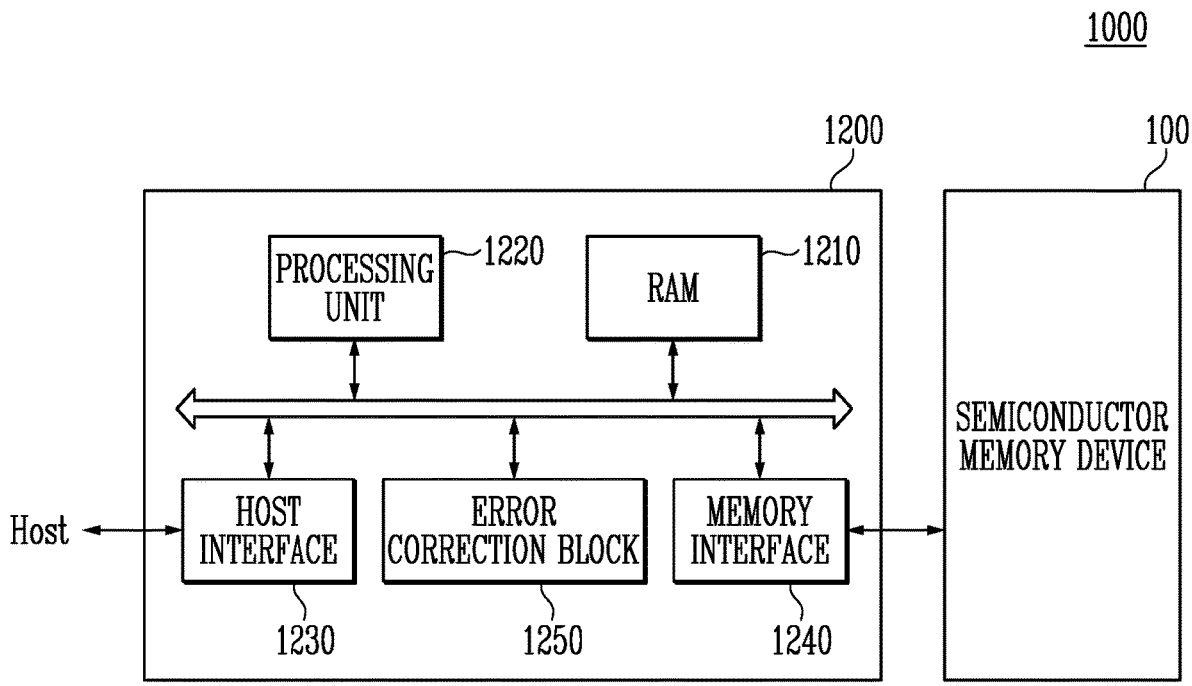
FIG. 15 is a block diagram illustrating a memory system including a semiconductor memory device, such as that of FIG. 1.

FIG. 15 is a block diagram illustrating a memory system 1000 including the semiconductor memory device 100 of FIG. 1.

Referring to FIG. 15, the memory system 1000 includes the semiconductor memory device 100 and a controller 1200.

The semiconductor memory device 100 may have the same configuration and operation as any of the semiconductor memory devices described with reference to FIGS. 1 to 14.

The controller 1200 is coupled to a host and the semiconductor memory device 100. The controller 1200 may access the semiconductor memory device 100 in response to a request from the host. For example, the controller 1200 may control a read operation, a write operation, an erase operation, and a background operation of the semiconductor memory device 100. The controller 1200 may provide an interface between the semiconductor memory device 100 and the host. The controller 1200 may drive firmware for controlling the semiconductor memory device 100.

The controller 1200 may include a random access memory (RAM) 1210, a processor 1220, a host interface 1230, a memory interface 1240, and an error correction block 1250. The RAM 1210 may be used as an operating memory for the processor 1220, a cache memory between the semiconductor memory device 100 and the host, and/or a buffer memory between the semiconductor memory device 100 and the host. The processor 1220 may control overall operation of the controller 1200.

The host interface 1230 may include a protocol for performing data exchange between the host and the controller 1200. In an embodiment, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and/or a private protocol.

The memory interface 1240 may interface with the semiconductor memory device 100. For example, the memory interface may include a NAND interface or a NOR interface.

The error correction block 1250 may use an error correcting code (ECC) to detect and correct an error in data received from the semiconductor memory device 100.

The controller 1200 and the semiconductor memory device 100 may be integrated into a single semiconductor device. In an embodiment, the controller 1200 and the semiconductor memory device 100 may be integrated into a single semiconductor device to form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

The controller 1200 and the semiconductor memory device 100 may be integrated into a single semiconductor device to form a solid state drive (SSD). The SSD may include a storage device configured to store data in a semiconductor memory. When the memory system 1000 is used as the SSD, the operating speed of the host coupled to the memory system 1000 may be greatly improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in any of various types of packages. For example, the semiconductor memory device 100 or the memory system 1000 may be packaged as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Figure 16:
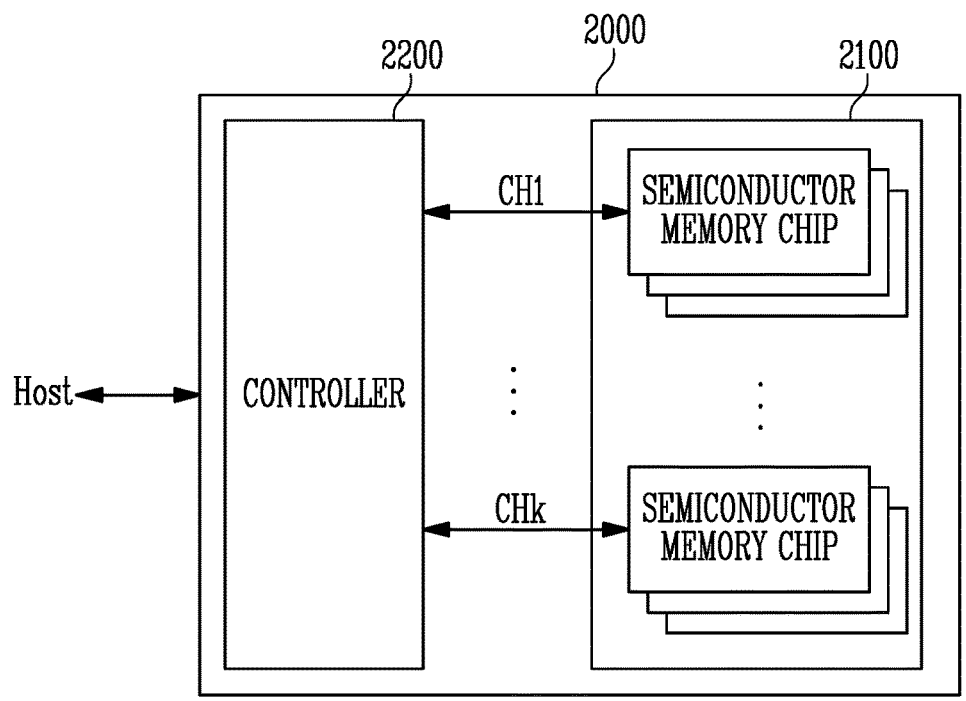
FIG. 16 is a block diagram illustrating an application of a memory system, such as that FIG. 15.

FIG. 16 is a block diagram illustrating an example 2000 of application of the memory system 1000 of FIG. 15.

Referring FIG. 16, a memory system 2000 may include a semiconductor memory device 2100 and a controller 2200. The semiconductor memory device 2100 includes a plurality of memory chips. The semiconductor memory chips may be divided into a plurality of groups, e.g., k groups.

In FIG. 16, it is illustrated that the k groups respectively communicate with the controller 2200 through first to k-th channels CH1 to CHk. Each semiconductor memory chip may have the same configuration and operation as the semiconductor memory device 100 described with reference to FIG. 1.

Each group may communicate with the controller 2200 through one common channel. The controller 2200 has the same configuration as that of the controller 1200 described with reference to FIG. 15 and is configured to control a plurality of memory chips of the semiconductor memory device 2100 through the plurality of channels CH1 to CHk.

In FIG. 16, a plurality of semiconductor memory chips in one group are coupled to one channel. However, it will be understood that the memory system 2000 may be modified into a configuration such that a single memory chip is coupled to a designated channel.

Figure 17:
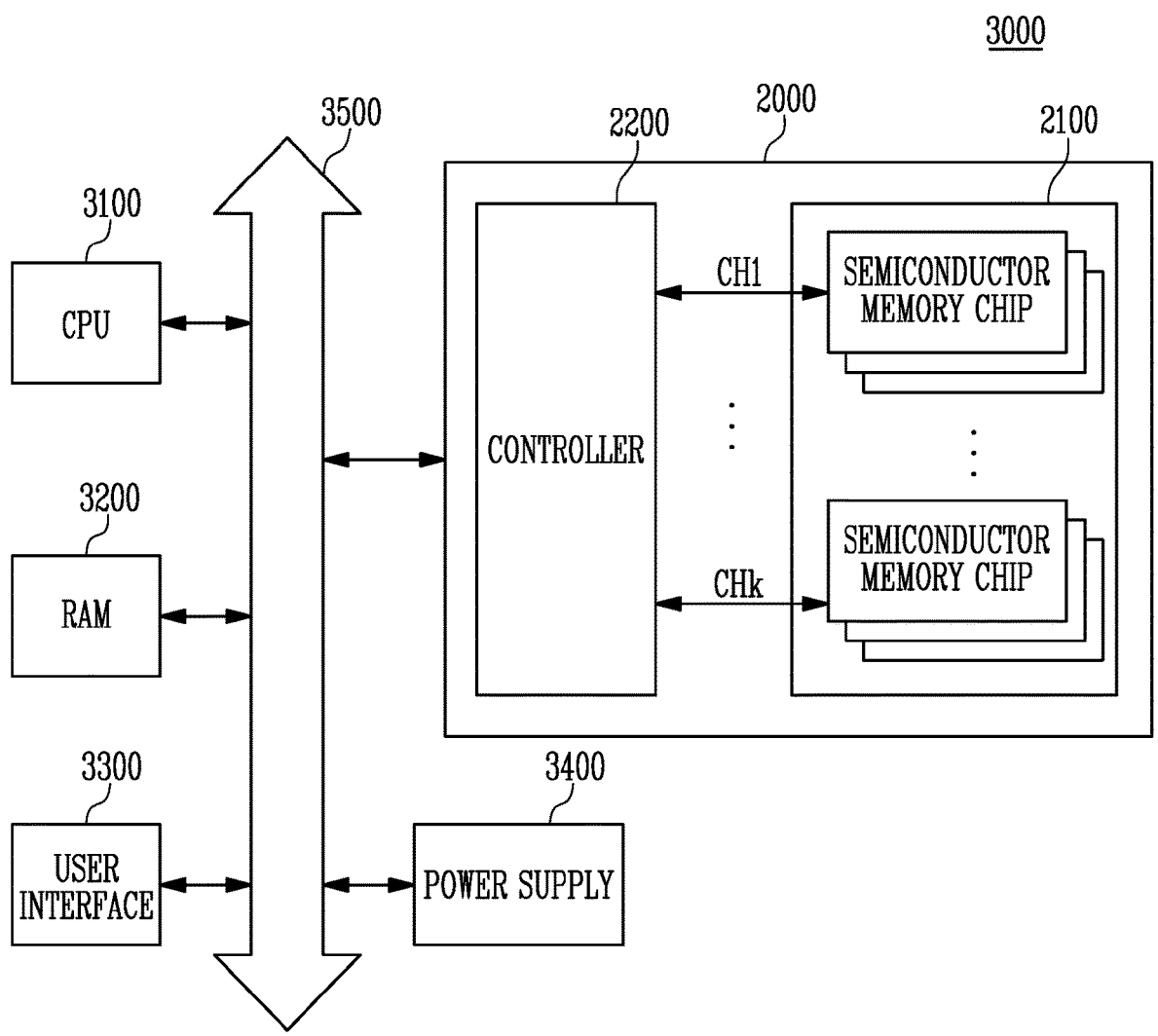
FIG. 17 is a block diagram illustrating a computing system including a memory system 2000, such as that shown in FIG. 16.

FIG. 17 is a block diagram illustrating a computing system 3000 including the memory system 2000 explained in relation to FIG. 16.

Referring to FIG. 17, the computing system 3000 includes a central processing unit (CPU) 3100, a random access memory (RAM) 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 17, the semiconductor memory device 2100 is illustrated as being coupled to the system bus 3500 through the controller 2200. However, in another embodiment, the semiconductor memory device 2100 may be directly coupled to the system bus 3500. The function of the controller 2200 may be performed by the CPU 3100 and the RAM 3200.

In FIG. 17, it is illustrated that the memory system 2000 described with reference to FIG. 16 is provided. However, the memory system 2000 of FIG. 17 may be the memory system 1000 described with reference to FIG. 15. In an embodiment, the computing system 3000 may include both memory systems 1000 and 2000.

Various embodiments of the present disclosure may provide a semiconductor memory device capable of programming a drain select transistor of a cell string.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory apparatus comprising:
a cell string including a drain select transistor coupled with a bit line, and memory cells coupled with the drain select transistor; and
a page buffer coupled to the cell string through the bit line, wherein the page buffer comprises:
a latch configured to store data of a value indicative of a result of a threshold voltage verification on the drain select transistor; and
a first current path configured to set a voltage of the bit line to a program inhibit voltage based on the value of the data stored in the latch,
wherein the first current path comprises:
a bit line select transistor coupled to the bit line;
a page buffer sensing transistor coupled between the bit line select transistor and a first node; and
a power supply transistor coupled between a power supply and the first node and configured to transmit a voltage of the power supply to the first node based on the data of the first value stored in the latch.

2. The semiconductor memory apparatus according to claim 1, wherein, when the result of the threshold voltage verification on the drain select transistor indicates that the threshold voltage verification has passed, the data stored by the latch has a first value and the first current path sets the voltage of the bit line to the program inhibit voltage based on the data of the first value stored in the latch.

3. The semiconductor memory apparatus according to claim 1, wherein the first current path further comprises an SO node transmission transistor and an SO node precharge transistor that are coupled in series between the page buffer sensing transistor and the power supply transistor.

4. The semiconductor memory apparatus according to claim 3,
wherein the bit line select transistor, the page buffer sensing transistor, and the SO node transmission transistor each are formed of an NMOS transistor, and
wherein the SO node precharge transistor and the power supply transistor each are formed of a PMOS transistor.

5. The semiconductor memory apparatus according to claim 4, wherein a voltage corresponding to the data stored in the latch is transmitted to a gate electrode of the power supply transistor.

6. The semiconductor memory apparatus according to claim 5, wherein, during at least a portion of a period in which the power supply transistor is turned on, the bit line select transistor, the page buffer sensing transistor, the SO node transmission transistor, and the SO node precharge transistor are turned on, so that the voltage of the power supply is transmitted to the bit line.

7. The semiconductor memory apparatus according to claim 1, further comprising a second current path configured to set the voltage of the bit line to a program enable voltage based on the value of the data stored in the latch.

8. The semiconductor memory apparatus according to claim 7, wherein, when the result of the threshold voltage verification on the drain select transistor indicates that the threshold voltage verification has failed, the data stored in the latch has a second value and the second current path sets the voltage of the bit line to the program enable voltage based on the data of the second value stored in the latch.

9. The semiconductor memory apparatus according to claim 8, wherein the second current path comprises:
the bit line select transistor;
the page buffer sensing transistor;
a sensing node discharge transistor coupled between the first node and a second node;
a latch transmission transistor coupled between the second node and a ground node,
wherein a voltage corresponding to the data stored in the latch is transmitted to a gate electrode of the latch transmission transistor.

10. The semiconductor memory apparatus according to claim 9, wherein each of the bit line select transistor, the page buffer sensing transistor, the sensing node discharge transistor, and the latch transmission transistor is an NMOS transistor.

11. The semiconductor memory apparatus according to claim 10,
wherein the latch transmission transistor is turned on based on a voltage corresponding to the data of the second value stored in the latch, and
wherein, during at least a portion of a period in which the latch transmission transistor is turned on, the bit line select transistor, the page buffer sensing transistor, and the sensing node discharge transistor are turned on, so that a ground voltage of the ground node is transmitted to the bit line.

12. A semiconductor memory apparatus comprising:
a cell string including a drain select transistor, and memory cells coupled with the drain select transistor;

a latch configured to store data of a value indicative of a result of a threshold voltage verification on the drain select transistor;

a bit line select transistor coupled to the drain select transistor;

a page buffer sensing transistor coupled between the bit line select transistor and a first node;

a power supply transistor coupled between a power supply and the first node; and a voltage select circuit configured to supply a voltage of the power supply, wherein the power supply transistor is selectively turned on based on the value of the data stored in the latch so that the voltage of the power supply is supplied to the bit line as a program inhibit voltage.

13. The semiconductor memory apparatus according to claim 12, further comprising an SO node transmission transistor and an SO node precharge transistor coupled in series between the page buffer sensing transistor and the power supply transistor, wherein the bit line select transistor, the page buffer sensing transistor, and the SO node transmission transistor each are formed of an NMOS transistor, and wherein each of the SO node precharge transistor and the power supply transistor is a PMOS transistor.

14. The semiconductor memory apparatus according to claim 13, wherein a voltage corresponding to the data stored in the latch is transmitted to a gate electrode of the power supply transistor, and wherein, when the result of the threshold voltage verification on the drain select transistor indicates that the threshold voltage verification has passed, the latch stores data of a first value, and the power supply transistor is turned on based on a voltage corresponding to the data of the first value stored in the latch.

15. The semiconductor memory apparatus according to claim 14, wherein, during at least a portion of a period in which the power supply transistor is turned on, the bit line select transistor, the page buffer sensing transistor, the SO node transmission transistor, and the SO node precharge transistor are turned on, so that the voltage of the power supply is transmitted to the bit line.

16. The semiconductor memory apparatus according to claim 13, further comprising:

a sensing node discharge transistor coupled between the first node and a second node; and a latch transmission transistor coupled between the second node and a ground node, wherein a voltage corresponding to the data stored in the latch is transmitted to a gate electrode of the latch transmission transistor.

17. The semiconductor memory apparatus according to claim 16, wherein the latch transmission transistor is turned on based on a voltage corresponding to the data of a second value stored in the latch, and wherein, during at least a portion of a period in which the latch transmission transistor is turned on, the bit line select transistor, the page buffer sensing transistor, and the sensing node discharge transistor are turned on, so that a ground voltage of the ground node is transmitted to the bit line.

18. The semiconductor memory apparatus according to claim 12, wherein the voltage select circuit supplies a first voltage as the voltage of the power supply during a program operation on the drain select transistor, and wherein a second voltage less than the first voltage is supplied as the voltage of the power supply during a verify operation on the drain select transistor.

* * * * *